US006933051B2

(12) United States Patent
Fleming et al.

(10) Patent No.: US 6,933,051 B2
(45) Date of Patent: *Aug. 23, 2005

(54) FLEXIBLE ELECTRICALLY CONDUCTIVE FILM

(75) Inventors: Robert James Fleming, Saint Paul, MN (US); Christopher Stewart Lyons, Saint Paul, MN (US); Clark Ivan Bright, Tucson, AZ (US); Edward John Anderson, Somerset, WI (US); Brian Leroy Koster, Mendota Heights, MN (US); Maria Lenni Zelinsky, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/222,449

(22) Filed: Aug. 17, 2002

(65) Prior Publication Data

US 2004/0033369 A1 Feb. 19, 2004

(51) Int. Cl.[7] ............................................. B32B 15/08
(52) U.S. Cl. ...................... 428/463; 219/203; 296/84.1; 359/360; 428/437; 428/442
(58) Field of Search ...................... 219/203; 296/84.1; 359/360; 428/437, 442, 463

(56) References Cited

U.S. PATENT DOCUMENTS

| | | |
|---|---|---|
| 3,302,002 A | 1/1967 | Warren |
| 3,311,517 A | 3/1967 | Keslar et al. |
| 3,529,074 A | 9/1970 | Lewis |
| 3,601,471 A | 8/1971 | Seddon et al. |
| 3,682,528 A | 8/1972 | Apfel et al. |
| 3,752,348 A | 8/1973 | Dickason et al. |
| 3,897,140 A | 7/1975 | Tuthill |
| 3,990,784 A | 11/1976 | Gelber |
| 4,017,661 A | 4/1977 | Gillery |
| 4,166,876 A | 9/1979 | Chiba et al. |
| 4,226,910 A | 10/1980 | Dahlen et al. |
| 4,234,654 A | 11/1980 | Yatabe et al. |
| 4,320,169 A | 3/1982 | Yatabe et al. |
| 4,413,877 A | 11/1983 | Suzuki et al. |
| 4,537,814 A | 8/1985 | Itoh et al. |
| 4,590,118 A | 5/1986 | Yatabe et al. |
| 4,639,069 A | 1/1987 | Yatabe et al. |
| 4,645,714 A | 2/1987 | Roche et al. |
| 4,696,719 A | 9/1987 | Bischoff |
| 4,722,515 A | 2/1988 | Ham |
| 4,782,216 A | 11/1988 | Woodard |
| 4,786,783 A | 11/1988 | Woodard |
| 4,799,745 A | 1/1989 | Meyer et al. |
| 4,842,893 A | 6/1989 | Yializis et al. |
| 4,910,090 A | 3/1990 | Kuhlman et al. |
| 4,954,371 A | 9/1990 | Yializis |
| 4,965,408 A | 10/1990 | Chapman et al. ...... 174/35 MS |
| 4,973,511 A | 11/1990 | Farmer et al. |
| 5,011,585 A | 4/1991 | Brochot et al. |
| 5,018,048 A | 5/1991 | Shaw et al. |
| 5,032,461 A | 7/1991 | Shaw et al. |
| 5,071,206 A | 12/1991 | Hood et al. |
| 5,085,141 A | 2/1992 | Triffaux |
| 5,091,244 A | 2/1992 | Biornard |
| 5,097,800 A | 3/1992 | Shaw et al. |
| 5,125,138 A | 6/1992 | Shaw et al. |
| 5,260,095 A | 11/1993 | Affinito |
| 5,324,374 A | 6/1994 | Harmand et al. |
| 5,332,888 A | 7/1994 | Tausch et al. |
| 5,356,947 A | 10/1994 | Ali et al. |
| 5,360,659 A | 11/1994 | Arends et al. |
| 5,395,644 A | 3/1995 | Affinito |
| 5,440,446 A | 8/1995 | Shaw et al. |
| 5,489,489 A | 2/1996 | Swirbel et al. |
| 5,547,508 A | 8/1996 | Affinito |
| 5,681,615 A | 10/1997 | Affinito et al. |
| 5,681,666 A | 10/1997 | Treger et al. |
| 5,686,360 A | 11/1997 | Harvey, III et al. |
| 5,699,188 A | 12/1997 | Gilbert et al. |
| 5,725,909 A | 3/1998 | Shaw et al. |
| 5,744,227 A | 4/1998 | Bright et al. |

(Continued)

FOREIGN PATENT DOCUMENTS

| | | |
|---|---|---|
| EP | 0 810 452 A2 | 12/1997 |
| EP | 0873839 A1 | 10/1998 |
| EP | 0944299 A2 A3 | 9/1999 |
| EP | 0977167 A1 | 2/2000 |
| WO | WO 92/12219 | 7/1992 |
| WO | WO 95/10117 | 4/1995 |
| WO | WO 97/01440 | 1/1997 |
| WO | WO 97/01778 | 1/1997 |
| WO | WO 97/04885 | 2/1997 |
| WO | WO 98/26927 | 6/1998 |
| WO | WO 99/36248 | 7/1999 |
| WO | WO 99/36262 | 7/1999 |
| WO | WO 00/26973 | 5/2000 |
| WO | WO 00/48749 | 8/2000 |
| WO | WO 01/31393 A1 | 5/2001 |
| WO | WO 01/58989 A1 | 8/2001 |
| WO | WO 01/96104 A2 | 12/2001 |
| WO | WO 01/96115 A1 | 12/2001 |

OTHER PUBLICATIONS

Article: Cairns et al., "Strain–Dependent Electrical Resistance of Tin–Doped Indium Oxide on Polymer Substrates," *Applied Physics Letters*, vol. 76, No. 11, Mar. 13, 2000, pp. 425–427.

(Continued)

*Primary Examiner*—D. S. Nakarani
(74) *Attorney, Agent, or Firm*—Pamela L. Stewart

(57) ABSTRACT

An electrically conductive film contains electrically connected first and second visible light-transmissive metal or metal alloy layers separated by a visible light-transmissive crosslinked polymeric layer. The film can be joined or laminated into glazing (especially non-planar vehicular safety glazing) with reduced likelihood that the metal or metal alloy layers will be damaged or distorted. The film also can transparently shield a device that can cause or is sensitive to electromagnetic interference with reduced likelihood that the metal or metal alloy layers will fracture.

21 Claims, 9 Drawing Sheets

U.S. PATENT DOCUMENTS

| | | | |
|---|---|---|---|
| 5,757,126 | A | 5/1998 | Harvey, III et al. |
| 5,771,562 | A | 6/1998 | Harvey, III et al. |
| 5,773,102 | A | 6/1998 | Rehfeld |
| 5,783,049 | A | 7/1998 | Bright et al. |
| 5,877,895 | A | 3/1999 | Shaw et al. ................ 359/588 |
| 5,981,059 | A | 11/1999 | Bright et al. |
| 6,007,901 | A | 12/1999 | Maschwitz et al. |
| 6,030,671 | A | 2/2000 | Yang et al. |
| 6,045,864 | A | 4/2000 | Lyons et al. |
| 6,049,419 | A | 4/2000 | Wheatley et al. |
| 6,083,628 | A | 7/2000 | Yializis |
| 6,111,698 | A | 8/2000 | Woodard et al. |
| 6,146,225 | A | 11/2000 | Sheats et al. |
| 6,204,480 | B1 | 3/2001 | Woodard et al. |
| 6,214,422 | B1 | 4/2001 | Yializis |
| 6,231,939 | B1 | 5/2001 | Shaw et al. |
| 6,243,201 | B1 | 6/2001 | Fleming et al. |
| 6,255,003 | B1 | 7/2001 | Woodard et al. |
| 6,268,695 | B1 | 7/2001 | Affinito |
| 6,413,645 | B1 | 7/2002 | Graff et al. |
| 6,492,026 | B1 | 12/2002 | Graff et al. |
| 6,522,067 | B1 | 2/2003 | Graff et al. |
| 6,573,652 | B1 | 6/2003 | Graff et al. |
| 2001/0010846 | A1 | 8/2001 | Hogmeister et al. |

OTHER PUBLICATIONS

Presentation: Affinito et al., "Polymer–Oxide Transparent Barrier Layers," SVC 39$^{th}$ Annual Technical Conference, Paper No. W–12, (1996), pp. 1–6.

Presentation: Shaw et al., "A New Vapor Deposition Process for Coating Paper and Polymer Webs," Sixth International Vacuum Web Coating Conference, Reno, NV, Oct. 28, 1992, pp. 18–24.

Presentation: Shaw et al., "A New High Speed Process for Vapor Depositing Acrylate Thin Films: An Update," Society of Vacuum Coaters 36$^{th}$ Annual Technical Conference (1993), pp. 348–352.

Presentation: Shaw et al., "Use of Vapor Deposited Acrylate Coatings to Improve the Barrier Properties of Metallized Film," Society of Vacuum Coaters 37$^{th}$ Annual Technical Conference (1994), pp. 240–247.

Presentation: Shaw et al., "Use of Evaporated Acrylate Coatings to Smooth the Surface of Polyester and Polypropylene Film Substrates," Rad Tech (1996), (12 pages).

Article: Affinito et al., "Vacuum Deposited Polymer/Metal Multilayer Films for Optical Application," *Thin Solid Films*, vol. 270, (1995), pp. 43–48.

Product Information: "Southwall™ Altair™ M Transparent Conductive Film," (date unknown but believed to be prior to filing date of present application), 1 page.

Product Information: "Shielded Windows," Advanced Performance Materials, (date unknown but believed to be prior to filing date of present application), 1 page.

Product Information: "EMI Shielding Products," Advanced Performance Materials, (date unknown but believed to be prior to filing date of present application), 2 pages.

Technological Information: "EMI Theory," Chomerics, (date unknown but believed to be prior to filing date of present application), pp. 1–3.

Technological Information: "Shielding Methods," Chomerics, (date unknown but believed to be prior to filing date of present application), pp. 1–7.

Product Information: "Display Products," Southwall Technologies, (date unknown but believed to be prior to filing date of present application), pp. 1–2.

Product Information: "BE 9 Shielded Windows," Advanced Performance Materials GMBH, (date unknown but believed to be prior to filing date of present application), pp. 60–67.

Affinito, J.D., "Vacuum deposited polymer/silver reflector material", SPIE Press, vol. 2262, Jul. 25, 1994, pp. 276–283.

FLEXIBLE ELECTRICALLY CONDUCTIVE FILM

FIELD OF THE INVENTION

This invention relates to electrically conductive films and optical articles made therefrom.

BACKGROUND

Glazing materials sometimes include one or more functional layers engineered to enhance the performance of the glazing. One important functional layer reduces transmission of infrared radiation. Infrared-rejecting functional layers are typically made of partially transparent metallized or dyed polymer film constructions that reflect or absorb unwanted solar radiation. References describing such functional layers include U.S. Pat. Nos. 4,590,118, 4,639,069 and 4,799,745. Conductive functional layers employing metallized film constructions can also be used for purposes such as antennae, electromagnetic interference (EMI) shielding, and for electrically heated film applications such as de-fogging, de-misting, defrosting or deicing of glazing and displays. Electrically heated film applications can require substantial current-carrying ability, but must employ a very thin (and accordingly very fragile) metal or metal alloy layer when visible light transparency is required. References describing such electrically heated film applications include U.S. Pat. Nos. 3,529,074, 4,782,216, 4,786,783, 5,324,374 and 5,332,888. Electrically heated films are of particular interest in vehicular safety glazing. Conventional vehicular safety glazing is a laminate of two rigid layers, typically glass, and an anti-lacerative mechanical energy-absorbing interlayer, typically plasticized polyvinyl butyral ("PVB"). Electrically heated glazing is prepared by placing the PVB layer, an electrically heated film layer and suitable electrodes between the glass layers, eliminating air from the engaging surfaces, and then subjecting the assembly to elevated temperature and pressure in an autoclave to fusion bond the PVB, electrically heated film layer and glass into an optically clear structure. The resulting electrically heated safety glazing can be used, for example, in the windshield, backlight, sunroof or side windows of an automobile, airplane, train or other vehicle.

To enhance vehicle aerodynamics and improve outward visibility, many vehicular window shapes are not planar, and increasingly include severe angles and complex curves. These angles and curves can make it very difficult to laminate an electrically heated functional layer into vehicle glazing. Sometimes electrical or optical defects arise immediately after lamination, and sometimes failures take place during use of the glazing.

SUMMARY OF THE INVENTION

Stretching of an electrically conductive functional layer can cause defects such as scratches or fissures. In electrically heated films these defects can cause hot spot formation when the film is energized, especially when the scratch or fissure is oriented perpendicular to the direction of current flow through the electrically heated functional layer. In EMI shielding these defects can cause electromagnetic energy leakage.

We believe such defects can be caused in part by the fragility of a transparent conductive layer or by the tendency of such a layer to corrode. In films containing a stack of transparent conductive layers, localized changes in the distance between the layers can be caused by the stretching, heating and cooling that may take place if the film is handled (e.g., laminated into glazing or formed into an EMI shield) or exposed to temperature variations in use. We believe these difficulties may be aggravated when a film containing a stack of conductive functional layers is placed adjacent to PVB. PVB sheets typically contain significant quantities of plasticizers and other adjuvants. We believe that these adjuvants can migrate into the film layers and cause corrosion, swelling or other effects that can lead to localized changes in the distance between the conductive functional layers.

The present invention provides, in one aspect, a process for making an electrically conductive visible light-transmissive film comprising:
  a) providing a visible light-transmissive flexible support,
  b) forming a visible light-transmissive first metal or metal alloy layer atop the support,
  c) forming an organic layer atop the first metal or metal alloy layer,
  d) crosslinking the organic layer to form a visible light-transmissive crosslinked polymeric layer,
  e) forming a visible light-transmissive second metal or metal alloy layer atop the crosslinked polymeric layer, and
  f) connecting one or more electrodes to at least one of the first and second metal or metal alloy layers.

The resulting films appear to have much better formability and resistance to failure than films employing an uncrosslinked organic layer or an inorganic layer between the first and second metal or metal alloy layers.

In a second aspect, the invention provides a process for making an electrically conductive glazing article, comprising assembling a layer of glazing material and a visible light-transmissive film comprising first and second visible light-transmissive metal or metal alloy layers separated by a visible light-transmissive crosslinked polymeric layer, bonding the glazing material and film together into a unitary article and connecting one or more electrodes to at least one of the metal or metal alloy layers.

In a third aspect, the invention provides a process for making an electrically heatable laminate article comprising:
  a) assembling a first layer of a glazing material, a first mechanical energy-absorbing layer, a visible light-transmissive flexible film layer comprising first and second metal or metal alloy layers separated by a crosslinked polymeric layer, electrodes that permit electrical current to be supplied to the metal or metal alloy layers, a second mechanical energy-absorbing layer and a second layer of glazing material,
  b) removing residual air from between the layers, and
  c) heating and applying pressure to the layers to bond the layers and electrodes together into a unitary article.

In a fourth aspect, the invention provides an electrically conductive visible light-transmissive film comprising electrically connected first and second visible light-transmissive metal or metal alloy layers separated by a visible light-transmissive crosslinked polymeric layer.

In a fifth aspect, the invention provides a safety glazing pre-laminate comprising at least one layer of a mechanical energy-absorbing material joined to a visible light-transmissive film comprising first and second visible light-transmissive metal or metal alloy layers separated by a visible light-transmissive crosslinked polymeric layer and further comprising electrodes that permit electrical current to be supplied to the metal or metal alloy layers.

In a sixth aspect, the invention provides an electrically heatable glazing article comprising at least one layer of a glazing material joined to a visible light-transmissive film comprising first and second visible light-transmissive metal or metal alloy layers separated by a visible light-transmissive crosslinked polymeric layer and further comprising electrodes that permit electrical current to be supplied to the metal or metal alloy layers. Preferably the glazing material in such glazing article comprises glass and the glazing article comprises an adhesive layer between the film and the glass.

In a seventh aspect, the invention provides a vehicle with electrically heatable glazing comprising at least one windshield, backlight, side window or skylight comprising a visible light-transmissive film comprising first and second visible light-transmissive metal or metal alloy layers separated by a crosslinked visible light-transmissive polymeric layer and further comprising electrodes that permit electrical current to be supplied to the metal or metal alloy layers.

The use of multiple electrically-conductive metal or metal alloy layers separated by crosslinked polymeric layers provides an article having increased resistance to delamination, fracture or current interruption when subjected to bending, flexing or stretching. Preferably the layers will maintain electrical conductivity after the application of more than 0.15 W/cm$^2$ power to the film despite bending or crinkling. Most preferably the layers will maintain electrical conductivity after exposure to corrosive conditions.

BRIEF DESCRIPTION OF THE DRAWINGS

Like reference symbols in the various figures of the drawing indicate like elements. The elements in the drawing are not to scale.

DETAILED DESCRIPTION

Figure 1:
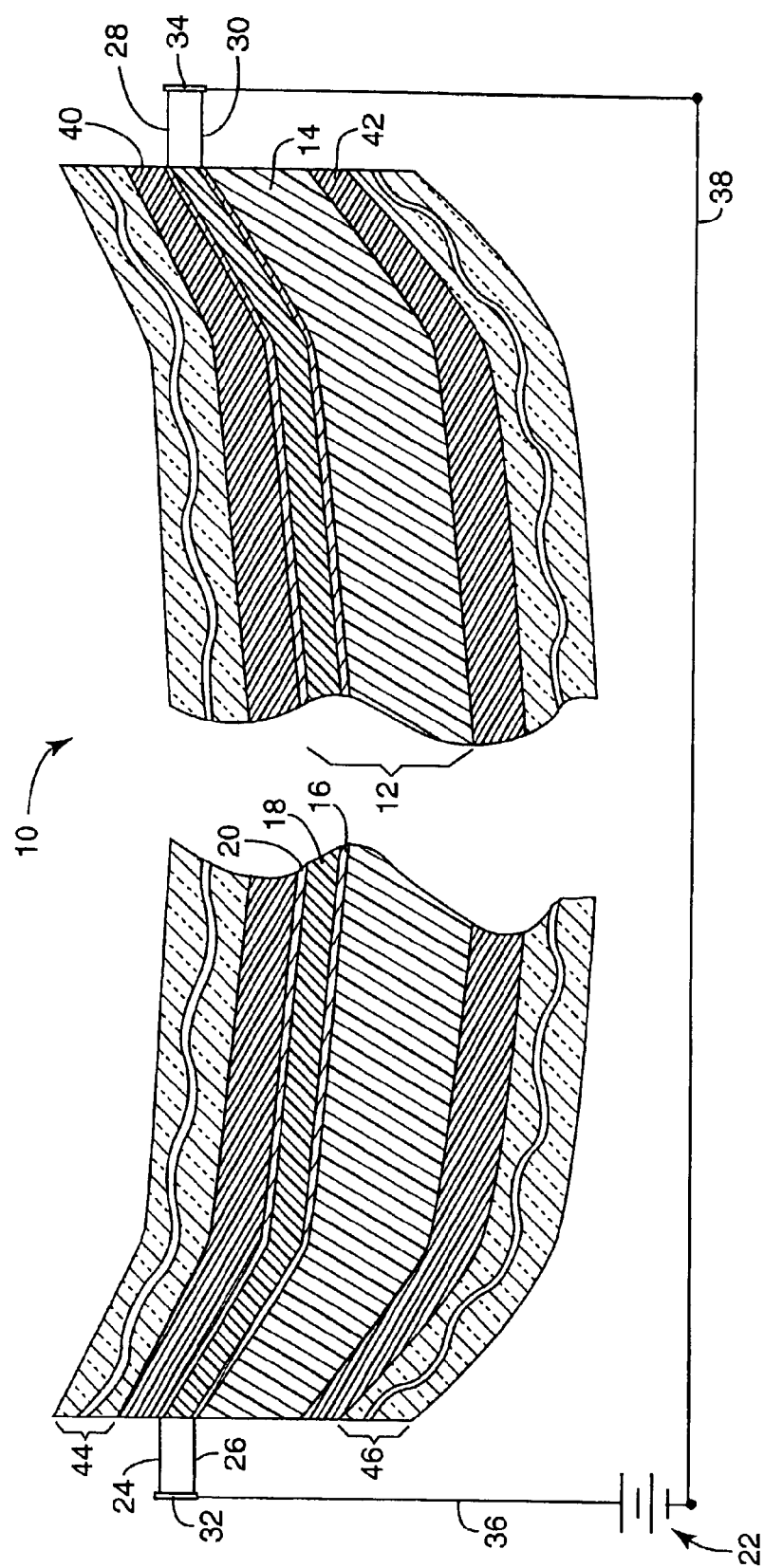
FIG. 1 is a schematic cross-sectional view of an electrically heatable article of the invention.

By using words of orientation such as "atop", "on", "uppermost" and the like for the location of various layers in the films or articles of the invention, we refer to the relative position of one or more layers with respect to a horizontal support layer. We do not intend that the films or articles should have any particular orientation in space during or after their manufacture.

By a "crosslinked" polymer, we mean a polymer in which polymer chains are joined together by covalent chemical bonds, usually via crosslinking molecules or groups, to form a network polymer. A crosslinked polymer is generally characterized by insolubility, but may be swellable in the presence of an appropriate solvent. The term "polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

By a "visible light-transmissive" support, layer, film or article, we mean that the support, layer, film or article has a transmission in the visible portion of the spectrum, $T_{vis}$, of at least about 20%, measured along the normal axis. By an "infrared-reflective" support, layer, film or article, we mean that the support, layer, film or article reflects at least about 50% of light in a band at least 100 nm wide in a wavelength region from about 700 nm to about 2000 nm, measured at a near-normal angle (e.g., at about a 6° angle of incidence). By "light" we mean solar radiation.

By a "non-planar" surface or article (e.g., of glass or other glazing material), we mean that surface or article has a continuous, intermittent, unidirectional or compound curvature. By a surface or article with "compound curvature", we mean that the surface or article curves in two different, non-linear directions from a single point.

By an "extensible" metal or metal alloy layer we refer to a layer that when incorporated into the visible light-transmissive film can be stretched by at least 3% in an in-place direction without loss of electrical continuity and without forming visible discontinuities in the surface of the metal or metal alloy layer as detected by the naked eye at a distance of about 0.25 meters.

By "without substantial cracking or creasing" we refer to a film that has been laminated into an article, and in which there is a lack of visible discontinuities in the surface of the film or the metal or metal alloy layers as detected by the naked eye at a distance of about 1 meter, preferably about 0.5 meters. By "without substantial wrinkling" we refer to a film that has been laminated into an article, and in which there is a lack of small ridges or furrows resulting from contraction of the smooth film surface as detected using the naked eye at a distance of about 1 meter, preferably about 0.5 meters. By "optically clear" we refer to a laminated article in which there is an absence of visibly noticeable distortion, haze or flaws as detected by the naked eye at a distance of about 1 meter, preferably about 0.5 meters.

By "electrically connected" layers we refer to conductive layers that are connected to at least one grounding electrode (e.g., for EMI shielding applications) or to two or more electrodes forming part of a circuit (e.g., for heating, intrusion detection or other current carrying or capacitative applications).

Referring to FIG. 1, electrically heatable article 10 includes a reflective functional layer 12 having a flexible plastic support layer 14, a first layer 16 of metal or metal alloy, a crosslinked polymeric layer 18 and a second layer 20 of metal or metal alloy. For brevity we will sometimes refer to metal or metal alloy layers such as layers 16 and 20 as "metal layers". Metal layers 16 and 18 are connected in parallel to voltage source 22 through electrodes 24, 26, 28 and 30, busbars 32 and 34 and connecting wires 36 and 38. Functional layer 12 is bonded on both of its major surface to PVB layers 40 and 42. PVB layers 40 and 42 are in turn bonded to glass sheets 44 and 46. Current flows through metal layers 16 and 18 and electrically heats functional layer 12 and glass sheets 44 and 46.

Figure 2:
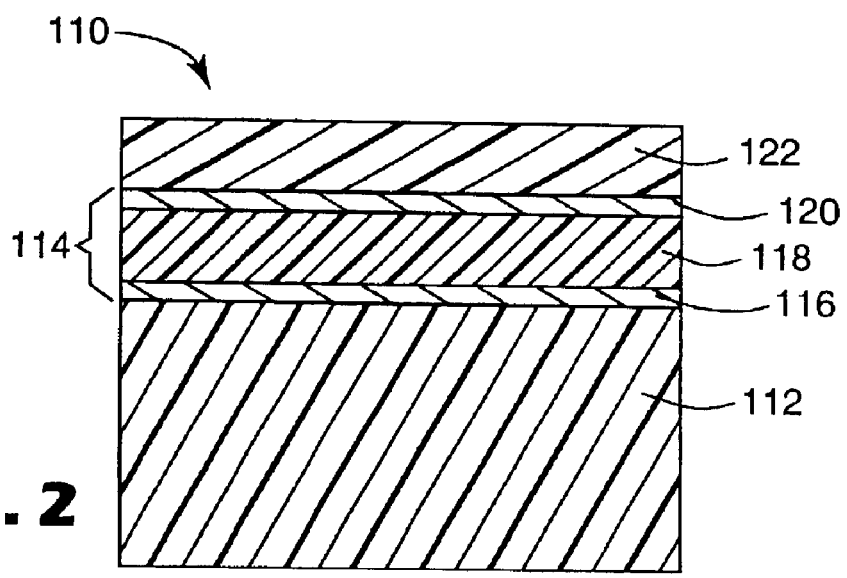
FIG. 2 is a schematic cross-sectional view of a film of the invention.

Referring to FIG. 2, a film of the invention is shown generally at 110. Film 110 includes flexible support 112 made of a visible light-transparent plastic film such as polyethylene terephthalate ("PET"). Fabry-Perot quarter wave interference stack 114 lies atop support 112. Stack 114 includes a first visible light-transparent metal layer 116 made of silver, a visible light-transparent layer 118 made of a crosslinked acrylate polymer, and a second visible light-transparent metal layer 120 made of silver. The crosslinked polymeric layer 118 has been formed in situ atop the first metal or alloy layer 116, as described in more detail below. Optional protective layer 122 made of a crosslinked acrylate polymer lies atop second metal layer 120 and stack 114. In a Fabry-Perot quarter wave stack such as stack 114, the thicknesses of the metal layers 116 and 120 and the intervening crosslinked polymeric layer 118 are carefully chosen. Metal layers 116 and 120 are sufficiently thin so that they are partially reflective and partially transmissive. Crosslinked polymeric layer 118 (which for brevity can also be referred to as the "spacing layer" or the "dielectric layer") has an optical thickness (defined as the physical thickness of the dielectric layer times its in-plane index of refraction) that is about ¼ the wavelength of the center of the desired pass band. Light whose wavelength is within the pass band is mainly transmitted through the thin metal layers 116 and 120. Light whose wavelength is above the pass band is mainly reflected by the thin metal layers 116 and 120 or canceled due to destructive interference.

Figure 3:
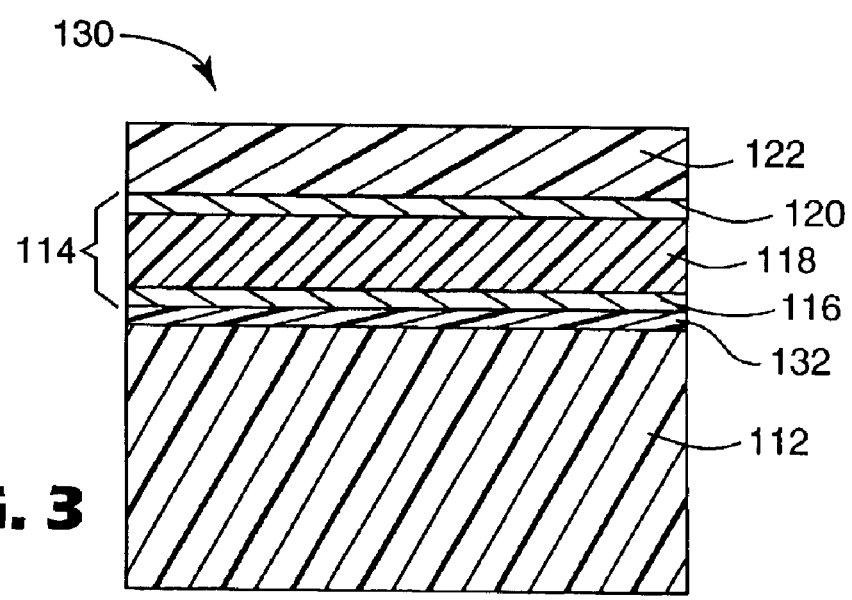
FIG. 3 is a schematic cross-sectional view of another film of the invention.

In FIG. 3, another film of the invention is shown generally at 130. Film 130 resembles film 110, but includes a base coat layer 132 made from crosslinked acrylate polymer between support 112 and stack 114.

Figure 4:
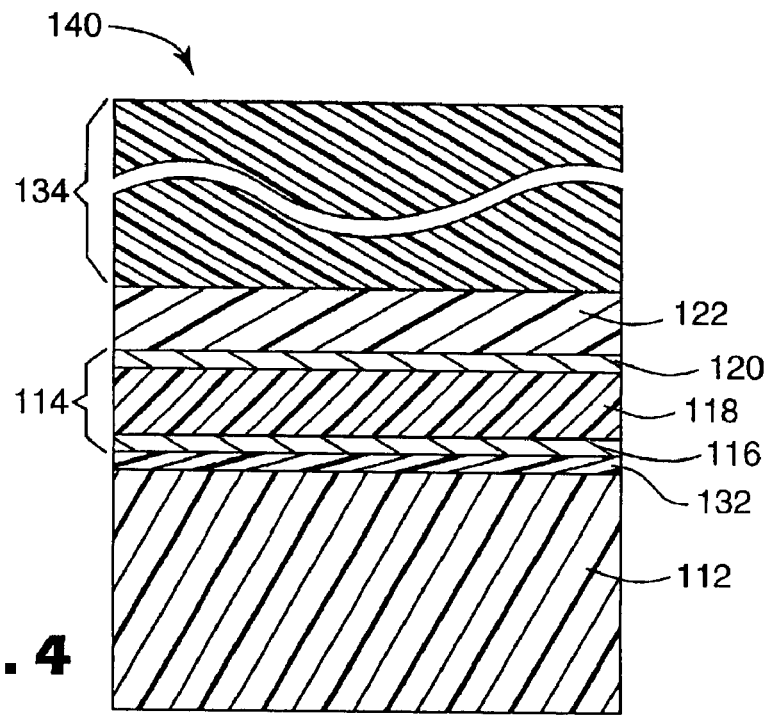
FIG. 4 is a schematic cross-sectional view of a pre-laminate of the invention.

FIG. 4 shows a pre-laminate 140 of the invention. Pre-laminate 140 includes a mechanical energy-absorbing layer 134 made of PVB joined to protective layer 122 of film 130.

Figure 5:
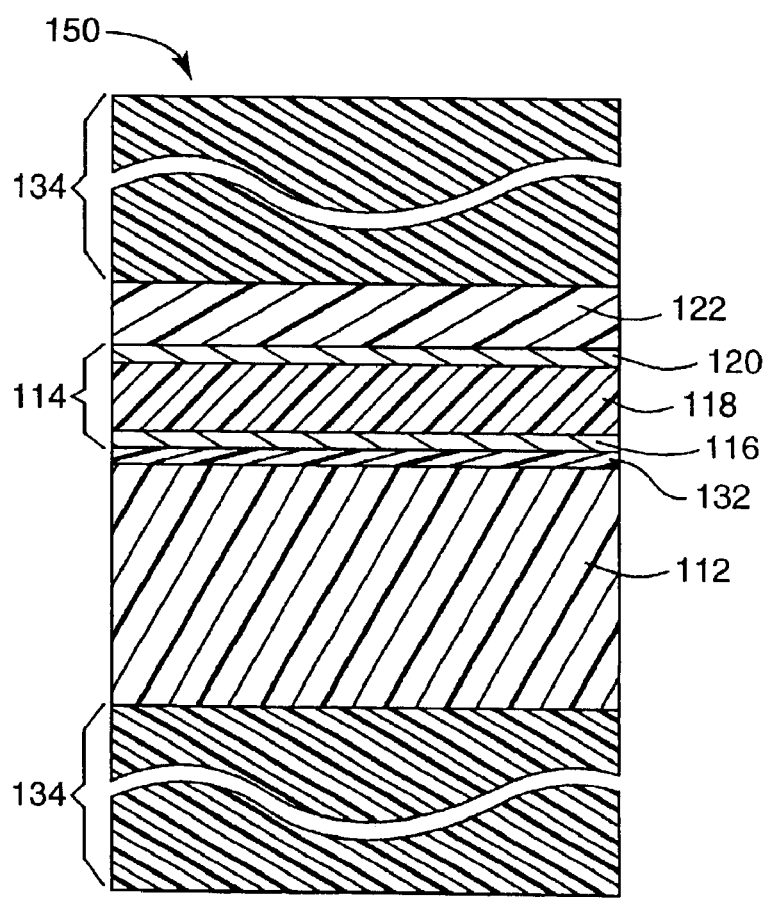
FIG. 5 is a schematic cross-sectional view of another pre-laminate of the invention.

FIG. 5 shows another pre-laminate 150 of the invention. Pre-laminate 150 includes a second mechanical energy-absorbing layer 134 joined to support 112 of film 140. This provides a more durable pre-laminate than the pre-laminate shown in FIG. 4.

Figure 6:
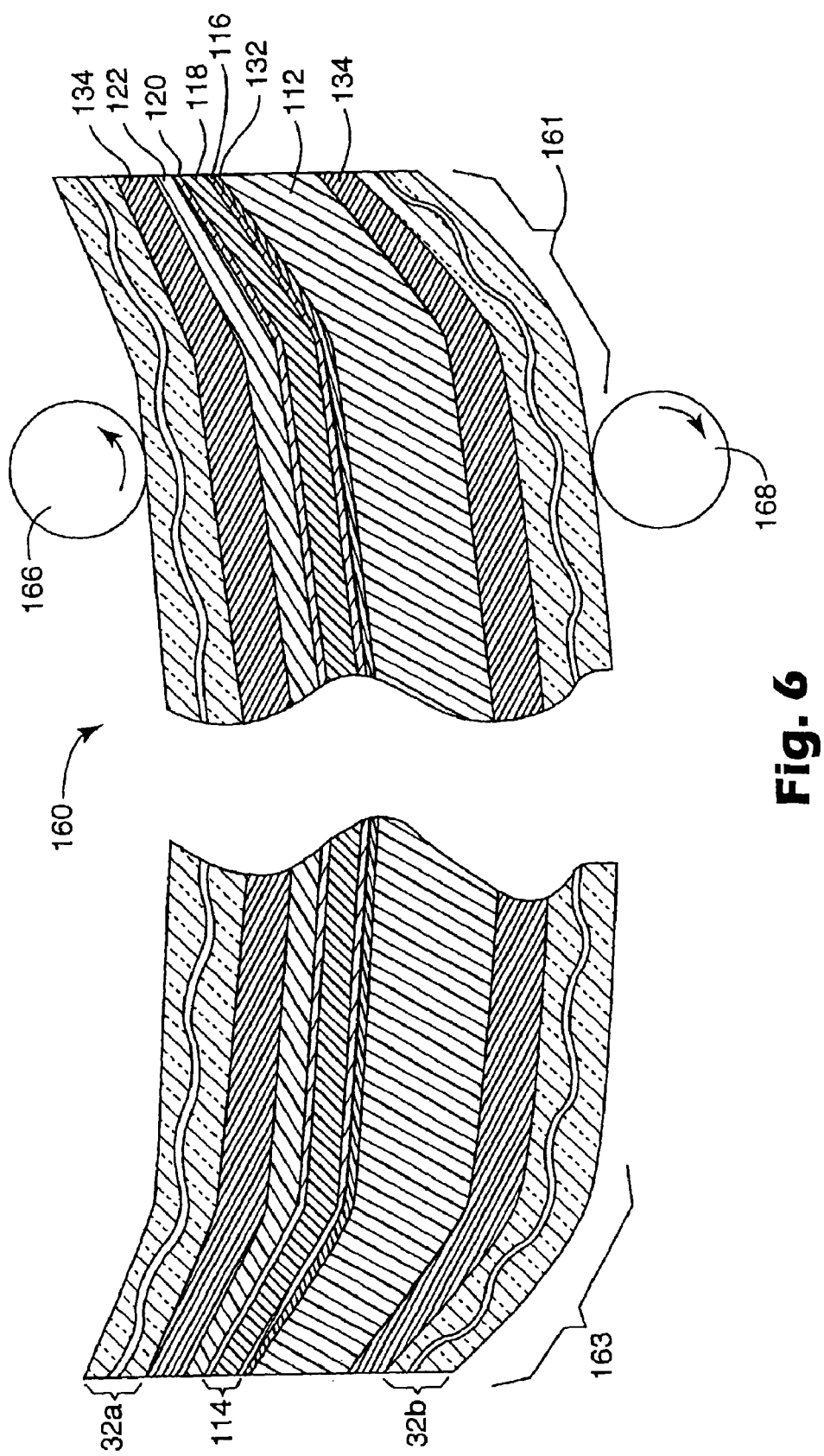
FIG. 6 is a schematic cross-sectional view of an electrically heatable windshield of the invention.

FIG. 6 shows a cross-sectional view of a laminated safety windshield of the invention 160. Windshield 160 has a continuously curved surface whose radius of curvature is relatively large near the center region (shown only as broken lines in FIG. 6) of windshield 160 but decreases to a relatively small value near the more sharply curved end regions 161, 163 of windshield 160. As shown in FIG. 6, nip rollers 166, 168 are being used to de-air and tack pre-laminate 150 between the two pieces of glass 32a and 32b. The lamination procedure typically is completed by heating the windshield in an autoclave (not shown in FIG. 6) under pressure.

Figure 7:
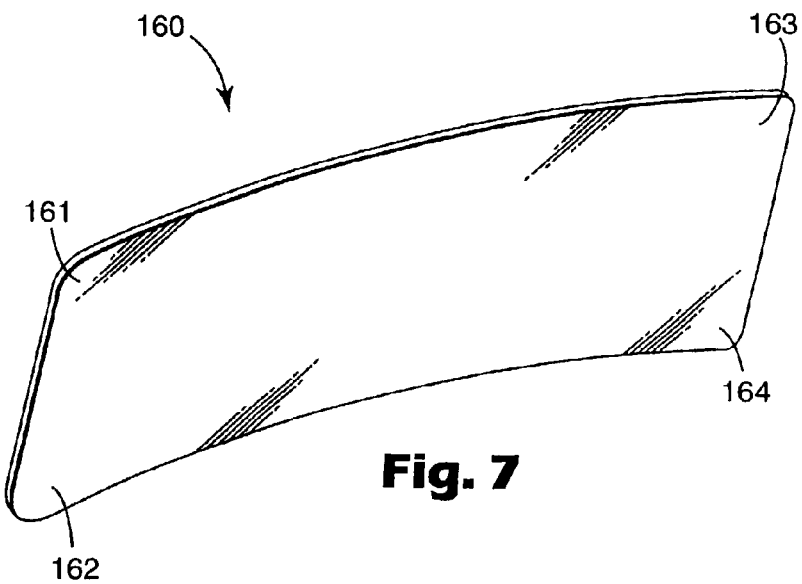
FIG. 7 is a perspective view of the windshield of FIG. 6.

FIG. 7 shows a perspective view of windshield 160 of FIG. 6. Curved regions 161, 162, 163 and 164 have compound curvatures. If pre-laminate 150 shrinks somewhat during the de-airing/lamination and autoclave steps that are used to form windshield 160, then it will be easier to obtain a wrinkle-free appearance through windshield 160.

The films of the invention include a visible light-transparent flexible support. Preferred supports have visible light transmission of at least about 70% at 550 nm. Particularly preferred supports are flexible plastic materials including thermoplastic films such as polyesters (e.g., PET), polyacrylates (e.g., polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide; and thermoset films such as cellulose derivatives, polyimide, polyimide benzoxazole and poly benzoxazole.

The support can also be a multilayer optical film ("MOF") coated with at least one crosslinked polymeric layer and metal or metal alloy layer, such as those described in copending application Ser. No. 10/222,473 filed Aug. 17, 2002 and entitled "Enhanced Heat Mirror Films", incorporated herein by reference.

Supports made of PET and MOF are especially preferred. Preferably the support has a thickness of about 0.01 to about 1 mm.

The films of the invention preferably include an infrared-rejecting Fabry-Perot optical interference stack. Each such stack includes a first metal layer, a crosslinked polymeric layer and a second metal layer. More than one such stack can be present in the film if desired. Additional stacks can conveniently be formed by placing additional crosslinked polymeric layers and metal layers atop the previous stack(s). Films containing such stacks are described in copending application Ser. No. 10/222,466 filed Aug. 17, 2002 and entitled "Polymer-Metal Infrared Interference Filter", incorporated herein by reference, and in the above mentioned copending application Ser. No. 10/222,473. The Fabry-Perot stack and the MOF support of the latter application combine to provide an infrared-rejecting film having a broadened reflection of infrared radiation compared to a film containing only the Fabry-Perot stack or only the MOF support. Use of a crosslinked polymeric spacing layer in the Fabry-Perot interference stack renders the film more readily orientable without damaging the metal layers or altering their spacing. Orienting and optionally heat-setting the MOF support or finished film can enhance the conformability of the film to non-planar surfaces.

The first, second and any additional metal layers in the articles of the invention can be the same as or different from one another. Preferred metals include elemental silver, gold, copper, nickel, and chrome, with silver being especially preferred. Alloys such as stainless steel or dispersions containing these metals in admixture with one another or with other metals also can be employed. The metal layers need not have the same thickness. Preferably the metal layers are sufficiently thick so as to be continuous, and sufficiently thin so as to ensure that the film and articles containing the film will have the desired degree of visible light transmission. Preferably the physical thickness (as opposed to the optical thickness) of the metal layers is about 3 to about 50 nm, more preferably about 4 to about 15 nm. Typically the first metal layer is formed by depositing it on the above-mentioned support. The first, second and any additional metal layers preferably are applied using techniques employed in the film metallizing art such as sputtering (e.g., cathode or planar magnetron sputtering), evaporation (e.g., resistive or electron beam evaporation), chemical vapor deposition, plating and the like.

The smoothness and continuity of the first metal layer and its adhesion to the support preferably are enhanced by appropriate pretreatment of the support. A preferred pre-treatment regimen involves electrical discharge pretreatment of the support in the presence of a reactive or non-reactive atmosphere (e.g., plasma, glow discharge, corona discharge, dielectric barrier discharge or atmospheric pressure discharge); chemical pretreatment; flame pretreatment; or application of a nucleating layer such as the oxides and alloys described in U.S. Pat. Nos. 3,601,471 and 3,682,528. These pretreatments help ensure that the surface of the support will be receptive to the subsequently applied metal layer. Plasma pretreatment is particularly preferred. A further particularly preferred pretreatment regimen involves coating the support with an inorganic or organic base coat layer such as layer 132 above, optionally followed by further pretreatment using plasma or one of the other pretreatments described above. Organic base coat layers, and especially base coat layers based on crosslinked acrylate polymers, are especially preferred. Most preferably, the base coat layer is formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696,719, 4,722,515, 4,842,893, 4,954,371, 5,018,048, 5,032,461, 5,097,800, 5,125,138, 5,440,446, 5,547,908, 6,045,864, 6,231,939 and 6,214,422; in published PCT Application No. WO 00/26973; in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43–48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). If desired, the base coat can also be applied using conventional coating methods such as roll coating (e.g., gravure roll coating) or spray coating (e.g., electrostatic spray coating), then crosslinked using, for example, UV radiation. The desired chemical composition and thickness of the base coat layer will depend in part on the nature of the support. For example, for a PET support, the base coat layer preferably is formed from an acrylate monomer and typically will have a thickness of only a few nm up to about 2 micrometers.

The adhesion of the first metal layer to the base coat layer can be further improved by including an adhesion-promoting or anticorrosion additive in the base coat layer. This can affect the surface energy or other relevant characteristics of the interface between the base coat layer and the first metal layer. Suitable adhesion-promoting or anticorrosion additives include mercaptans, thiol-containing compounds, acids (such as carboxylic acids or organic phosphoric acids), triazoles, dyes and wetting agents. Ethylene glycol bis-thioglycolate (described in U.S. Pat. No. 4,645,714) is a particularly preferred additive. The additive preferably is present in amounts sufficient to obtain the desired degree of increased adhesion, without causing undue oxidation or other degradation of the first metal layer.

The crosslinked polymeric layer lies atop the first metal layer, and can be formed from a variety of organic materials. Preferably the polymeric layer is crosslinked in situ atop the first metal or alloy layer. If desired, the polymeric layer can be applied using conventional coating methods such as roll coating (e.g., gravure roll coating) or spray coating (e.g., electrostatic spray coating), then crosslinked using, for example, UV radiation. Most preferably the polymeric layer is formed by flash evaporation, vapor deposition and crosslinking of a monomer as described above. Volatilizable (meth)acrylate monomers are preferred for use in such a process, with volatilizable acrylate monomers being especially preferred. Preferred (meth)acrylates have a molecular weight in the range of about 150 to about 600, more preferably about 200 to about 400. Other preferred (meth)acrylates have a value of the ratio of the molecular weight to the number of acrylate functional groups per molecule in the range of about 150 to about 600 g/mole/(meth)acrylate group, more preferably about 200 to about 400 g/mole/(meth)acrylate group. Fluorinated (meth)acrylates can be used at higher molecular weight ranges or ratios, e.g., about 400 to about 3000 molecular weight or about 400 to about 3000 g/mole/(meth)acrylate group. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof. The physical thickness of the crosslinked polymeric layer will depend in part upon its refractive index and in part upon the desired optical characteristics of the film (e.g., on whether the film should contain a Fabry-Perot stack). For use in an infrared-rejecting Fabry-Perot stack, the crosslinked polymeric spacing layer typically will have a refractive index of about 1.3 to about 1.7, and preferably will have an optical thickness of about 75 to about 200 nm, more preferably about 100 to about 150 nm and a corresponding physical thickness of about 50 to about 130 nm, more preferably about 65 to about 100 nm.

Optical modeling can be employed to design suitable layer thicknesses in the articles of the invention. For example, for a 51 micrometer thick PET support coated with a 5 layer infrared-rejecting acrylate/metal/acrylate/metal/acrylate optical stack in which the base coat, crosslinked polymeric spacing layer and topcoat are made of tripropylene glycol diacrylate (refractive index 1.4662) and the metal layers are made of magnetron sputtered silver (refractive index 0.154), two exemplary target structures have respective layer physical thicknesses from the base coat through the topcoat of 129/12/104/12/54 nm or 116/10/116/10/55 nm.

A crosslinked polymeric spacing layer has several advantages over a non-crosslinked polymeric spacing layer. A crosslinked polymeric spacing layer will neither melt nor soften as appreciably with heating as a non-crosslinked polymeric spacing layer, and thus is less likely to flow, deform or thin significantly under the simultaneous influence of temperature and pressure, as during a forming or laminating process. A crosslinked polymeric spacing layer is highly solvent resistant, whereas a non-crosslinked polymeric spacing layer may be dissolved or appreciably softened by solvents such as those used to form the non-crosslinked polymeric spacing layer. Crosslinked polymeric spacing layers can have greater resistance to liquids that may be encountered by the films of the present invention, such as cleaning solutions for window applications and automotive fluids such as gasoline, oil, transmission fluid, etc., for automotive applications. A crosslinked polymeric spacing layer may also have desirable physical properties compared to a non-crosslinked polymeric spacing layer fabricated from a similar polymer, such as higher modulus and stiffness, better elastic recovery when strained or better resilience.

The smoothness and continuity of the crosslinked polymeric layer and its adhesion to the first metal layer preferably are enhanced by appropriate pretreatment of the first metal layer prior to application of the crosslinked polymeric layer, or by inclusion of a suitable additive in the crosslinked polymeric layer. Preferred pretreatments include the support pretreatments described above, with plasma pretreatment of the first metal layer being particularly preferred. Preferred additives for the crosslinked polymeric layer include the base coat layer additives described above.

The smoothness and continuity of the second metal layer and its adhesion to the crosslinked polymeric layer preferably are enhanced by appropriate pretreatment of the crosslinked polymeric layer prior to application of the second metal layer, or by inclusion of a suitable additive in the crosslinked polymeric layer. Preferred pretreatments include the support pretreatments described above, with plasma pretreatment of the crosslinked polymeric layer being particularly preferred. Preferred additives for the crosslinked polymeric layer include the base coat layer additives described above.

Surprisingly, we have also discovered that when one or both of the above-described pretreatments is employed, and when one or more of the above-described base coat layer additives is incorporated into the monomer mixture used for forming the spacing layer(s), the resistance of the metal layer(s) to corrosion under the influence of an electrical current is markedly enhanced. Plasma treatment is a preferred pretreatment, with a nitrogen plasma being especially preferred. Ethylene glycol bis-thioglycolate is a preferred additive for incorporation into the monomer mixture.

If desired, additional pairs of crosslinked polymeric spacing layers and metal layers can be applied atop the second metal layer. For example, stacks containing 3 metal layers or 4 metal layers provide desirable characteristics for some applications. Stacks containing 2 to 4 metal layers in which each of the metal layers has a crosslinked polymeric layer adjacent to each of its faces are especially preferred.

The uppermost metal layer preferably is overcoated with a suitable protective layer such as layer 122 above. If desired, the protective layer can be applied using conventional coating methods such as roll coating (e.g., gravure roll coating) or spray coating (e.g., electrostatic spray coating), then crosslinked using, for example, UV radiation. Most preferably the protective layer is formed by flash evaporation, vapor deposition and crosslinking of a monomer as described above. Volatilizable (meth)acrylate monomers are preferred for use in such a protective layer, with volatilizable acrylate monomers being especially preferred. When the film of the invention includes a protection layer or other surface layer and is laminated between sheets of a mechanical energy-absorbing material such as PVB, the index of refraction of the protection layer or other surface layer can be selected to minimize reflection at the interface caused by any difference in refractive indices between the PVB and the film. The protective layer can also be post-treated to enhance adhesion of the protective layer to a mechanical energy-absorbing material such as PVB. Preferred post-treatments include the support pretreatments described above, with plasma post-treatment of both sides of the film being particularly preferred. Preferred additives for the protective layer include the base coat layer additives described above.

Figure 8:
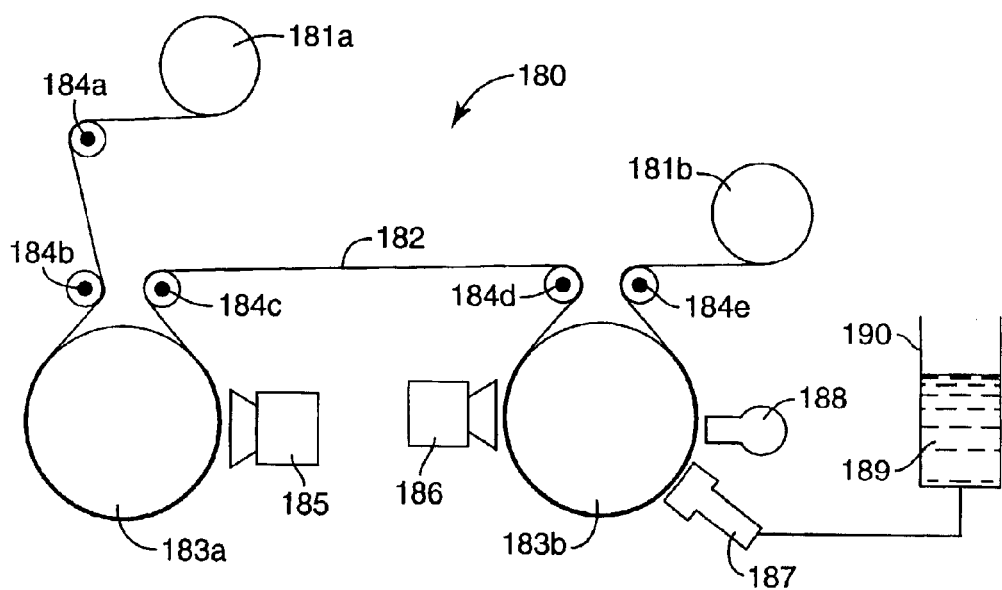
FIG. 8 is a schematic view of an apparatus for carrying out a process of the invention.

An apparatus 180 that can conveniently be used to manufacture the films of the invention is shown in FIG. 8. Powered reels 181a and 181b move supporting web 182 back and forth through apparatus 180. Temperature-controlled rotating drums 183a and 183b, and idlers 184a, 184b, 184c, 184d and 184e carry web 182 past metal sputtering applicator 185, plasma pretreater 186, monomer evaporator 187 and E-beam crosslinking apparatus 188. Liquid monomer 189 is supplied to evaporator 187 from reservoir 190. Successive layers can be applied to web 182 using multiple passes through apparatus 180. Apparatus 180 can be enclosed in a suitable chamber (not shown in FIG. 8) and maintained under vacuum or supplied with a suitable inert atmosphere in order to discourage oxygen, water vapor, dust and other atmospheric contaminants from interfering with the various pretreatment, monomer coating, crosslinking and sputtering steps.

The pre-laminates of the invention are formed by joining a film of the invention to one or more mechanical energy-absorbing layers such as layers 134. The mechanical energy-absorbing layers can be made from a variety of materials that will be familiar to those skilled in the art, including PVB, polyurethanes ("PURs"), polyvinyl chloride, polyvinyl acetal, polyethylene, ethylene vinyl acetates and SUR-LYN™ resins (E. I. duPont de Nemours & Co.). PVB is a preferred material for the mechanical energy-absorbing layer. The thickness of the mechanical energy-absorbing layer will depend upon the desired application, but typically will be about 0.3 to about 1 mm.

Various functional layers or coatings can be added to the films or pre-laminates of the present invention to alter or improve their physical or chemical properties, particularly at the surface of the film or pre-laminate. Such layers or coatings can include, for example, low friction coatings or slip particles to make the film or the pre-laminate easier to handle during the manufacturing process; particles to add diffusion properties to the film or pre-laminate or to prevent wet-out or Newton's rings when the film or pre-laminate is placed next to another film or surface; adhesives such as pressure sensitive adhesives or hot melt adhesives; primers to promote adhesion to adjacent layers; and low adhesion backsize materials for use when the film or pre-laminate is to be used in adhesive roll form. The functional layers or coatings can also include shatter resistant, anti-intrusion, or puncture-tear resistant films and coatings, for example, the functional layers described in WO 01/96115. Additional functional layers or coatings can include vibration-damping film layers such as those described in WO 98/26927 and U.S. Pat. No. 5,773,102, and barrier layers to provide protection or to alter the transmissive properties of the film or pre-laminate towards liquids such as water or organic solvents or towards gases such as oxygen, water vapor or carbon dioxide. These functional components can be incorporated into one or more of the outermost layers of the film or pre-laminate, or they can be applied as a separate film or coating.

For some applications, it may be desirable to alter the appearance or performance of the film or pre-laminate, such as by laminating a dyed film layer to the film or pre-laminate, applying a pigmented coating to the surface of the film or pre-laminate, or including a dye or pigment in one or more of the materials used to make the film or pre-laminate. The dye or pigment can absorb in one or more selected regions of the spectrum, including portions of the infrared, ultraviolet or visible spectrum. The dye or pigment can be used to complement the properties of the film or pre-laminate, particularly where the film or pre-laminate transmits some frequencies while reflecting others. A particularly useful pigmented layer that can be employed in the films or pre-laminates of the invention is described in WO 2001/58989. This layer can be laminated, extrusion coated or coextruded as a skin layer on the film or pre-laminate. The pigment loading level can be varied between about 0.01 and about 1.0% by weight to vary the visible light transmission as desired. The addition of a UV absorptive cover layer can also be desirable in order to protect any inner layers of the film that may be unstable when exposed to UV radiation.

Additional functional layers or coatings that can be added to the film or pre-laminate include, for example, antistatic coatings or films; flame retardants; UV stabilizers; abrasion resistant or hardcoat materials; optical coatings; anti-fogging materials; magnetic or magneto-optic coatings or films; liquid crystal panels; electrochromic or electroluminescent panels; photographic emulsions; prismatic films; and holographic films or images. Additional functional layers or coatings are described, for example, in WO 97/01440, WO 99/36262, and WO 99/36248.

The film or pre-laminate can be treated with, for example, inks or other printed indicia such as those used to display product identification, orientation information, advertisements, warnings, decoration, or other information. Various techniques can be used to print on the film, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

The films and pre-laminates of the invention can be joined or laminated to a wide variety of substrates. Typical substrate materials include glazing materials such as glass (which may be insulated, tempered, laminated, annealed, or heat strengthened) and plastics (such as polycarbonates and polymethylmethacrylate). The invention is especially useful in connection with non-planar substrates, especially those having a compound curvature. The films or pre-laminates of the invention preferably are capable of conforming to such non-planar substrates during a lamination and de-airing process without substantial cracking or creasing.

The films of the invention (or the support on which such a film may be formed) can be oriented and optionally heat set under conditions sufficient to assist the film in conforming without substantial wrinkling to a non-planar substrate. This is especially useful when a non-planar substrate to which a film of the invention is to be laminated has a known shape or curvature, and especially when the laminate has a known severe compound curvature. By individually controlling the shrinkage of the film or support in each in-plane direction, the film can be caused to shrink in a controlled fashion during lamination, especially during nip roll lamination. For example, if the non-planar substrate to which the film is to be laminated has a compound curvature, then the shrinkage of the film can be tailored in each in-plane direction to match the specific curvature characteristics of the substrate in those directions. The in-plane film or support direction having the greatest shrinkage preferably is aligned with the dimension of the substrate having the least curvature, that is, the greatest radius of curvature. In addition to or in place of characterizing curvature according to the radius of curvature, other measurements (such as the depth of a raised or depressed area measured from the geometric surface defined by a major surface of the substrate) can also be used if desired. For lamination to typical non-planar substrates, the film shrinkage preferably will be greater than about 0.4% in both in-plane directions, more preferably greater than about 0.7% in at least one in-plane direction, and most preferably greater than about 1% in at least one in-plane direction. The overall film shrinkage preferably is limited to reduce edge delamination or "pull-in." Thus the film shrinkage preferably is less than about 3% in each in-plane direction, and more preferably less than about 2.5% in each in-plane direction. Shrinkage behavior will primarily be governed by factors such as the film or support materials employed, and the film or support stretch ratio(s), heatset temperature, residence time and toe-in (the decrease in rail spacing in a tenter heatset zone measured relative to a maximum rail setting). Coatings can also change the shrinkage properties of a film. For example, a primer coating may reduce the transverse direction ("TD") shrinkage by about 0.2% to about 0.4% and increase the machine direction ("MD") shrinkage by about 0.1 to about 0.3%. Orienting and heat setting equipment can vary widely, and ideal process settings typically are determined experimentally in each case. Further details regarding techniques for manufacturing MOF supports having targeted shrinkage properties are described in WO 01/96104, the disclosure of which is incorporated herein by reference.

The metal layers in the films of the invention can be separately connected to ground and to one or more electrical circuits, electrically connected to one another in series or electrically connected in parallel. When connected in parallel, the layers can provide enhanced current carrying capacity. The electrodes can be formed using masking, plating and other printed circuitry techniques that will be familiar to those skilled in the art, or formed using metallic strips, wires, conductive paints and other connections that will likewise be familiar to those skilled in the art. Appropriate busbars can be employed when two or more metal layers are connected in series or in parallel. The electrodes can be connected to the metal layers before or after the film is joined to other materials (e.g., glazing) or articles (e.g., a nontransparent housing or partial housing for a device that causes or is sensitive to EMI).

As mentioned above, the films of the invention can initially be laminated to a mechanical energy-absorbing layer or layers to form a pre-laminate and then later laminated to a vehicular glazing sheet or sheets. A sandwich containing the film, electrodes, the mechanical energy-absorbing layer or layers and the glazing sheet or sheets can also be assembled in a single lamination step. In either case, air should be removed from between the various layers during each lamination step. In general it will be preferable to preheat at least the film and one or more of the mechanical energy-absorbing layer or layers in an oven to a temperature below the Tg of the outermost film layer prior to lamination. Preferably, some level of adhesion should be established between the mechanical energy-absorbing layer or layers, the film, the electrodes and the glazing sheet or sheets. However, the mechanical energy-absorbing layer or layers preferably should not become sufficiently soft to flow before the final lamination step takes place. The mechanical energy-absorbing layer or layers preferably should help to tack the edges of the pre-laminate in position so that the film can shrink and form itself to the shape of the completed laminate. The laminate preferably is cooled at a controlled rate after autoclaving to avoid possible wrinkling within the film or delamination at the edges of the film. De-airing can be accelerated using the vacuum de-airing or nip roll processes described above. Preferably de-airing and lamination are carried out using one or more nip rollers. A representative nip roll apparatus is shown in U.S. Pat. No. 5,085,141. Other such devices will be familiar to those skilled in the art.

Following lamination, the laminate preferably is heated in an autoclave to a temperature sufficient to cause the mechanical energy-absorbing layer or layers and the film of the invention to conform to the contours of the glazing sheet or sheets and form a final laminated glazing article. Sufficient pressure should also be applied during lamination to obtain at least partial bonding of the various layers of the laminate. For laminates containing PVB, temperatures of about 138° C. to about 150° C. and pressures of about 0.5 to about 1.5 MPa are typical. The heat and pressure cause the mechanical energy-absorbing layer or layers to flow and spread to fill up voids, form a uniform sandwich construction, and firmly bond the laminate layers together, while removing residual air (or dissolving it in the PVB) in a minimal time frame. Although autoclave cycles can vary significantly, depending on the manufacturer, one typical autoclave cycle involves (a) increasing the temperature and pressure from ambient to about 93° C. and about 0.55 MPa within about 15 minutes, (b) increasing temperature to about 143° C. while holding the pressure at about 0.55 MPa within about 40 minutes, (c) increasing the pressure to about 1.38 MPa while holding the temperature at about 143° C. within about 10 minutes, (d) holding at this maximum temperature and pressure for about 20 minutes, (e) decreasing the temperature and the pressure to about 38° C. and about 1 MPa within about 15 minutes, and (f) decreasing the pressure to ambient within about 4 minutes. The entire autoclave cycle is typically about 60 minutes to about 120 minutes.

Figure 9:
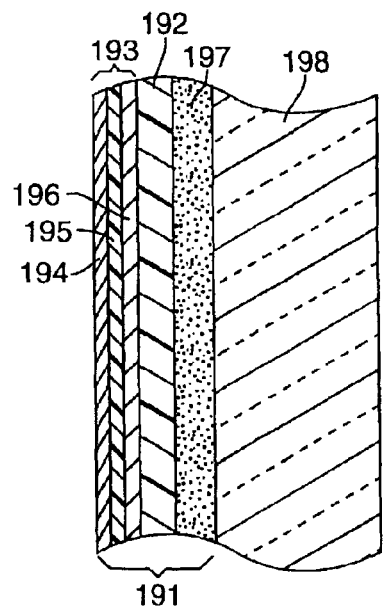
FIG. 9 is a schematic cross-sectional view of electrically heatable architectural glazing of the invention.

The films of the invention can also be employed in architectural glazing, e.g., such as the glazing articles described in U.S. Pat. No. 4,799,745. The manner of making such glazing articles will be apparent to those skilled in the art. For example, useful architectural glazing articles can be made by substituting a crosslinked polymeric spacing layer for the spacing layer 18 in U.S. Pat. No. 4,799,745. The finished glazing articles of the present invention preferably are optically clear. FIG. 9 shows a film 191 of the invention containing substrate 192 and Fabry-Perot stack 193 containing first and second metal layers 194 and 196 separated by spacing layer 195. Film 191 is joined to a glass sheet 198 using a layer 197 of pressure sensitive adhesive. herewith and entitled "Durable Transparent EMI Shielding Film", incorporated herein The films of the invention can provide optically transparent, flexible EMI shielding that can block the transmission of unwanted electromagnetic energy out of or into electronic equipment and other devices that can cause or are sensitive to electromagnetic interference. Such EMI shielding is described in copending application Ser. No. 10/222, 465 filed Aug. 17, 2002 and entitled "Durable Transparent EMI Shielding Film", incorporated herein by reference. The films of the invention can be used to at least partially surround a device with a visible light-transmissive film comprising first and second visible light-transmissive metal or metal alloy layers separated by a visible light-transmissive crosslinked polymeric layer, wherein at least one grounding electrode is connected to at least one of the metal or metal alloy layers. The films of the invention can provide dramatically better mechanical durability and corrosion resistance than typical commercially available optically transparent EMI shielding films, while providing comparable optical transparency and shielding power.

Electrical connections can readily be made to the films of the invention with minimal or no surface preparation. 3M™ Conductive Tapes 9703 and 9713 (3M, St. Paul Minn.) are particularly preferred for making such electrical connections. These tapes contain fibers or particles which, once the tapes have been applied to a film of the invention, penetrate the outermost crosslinked polymer layer (when present) and provide an electrical connection to the metal layer (e.g., silver) beneath. In such films the conductive metal layer is both well-protected against corrosion via environmental exposure and accessible for electrical connection.

Alternating or direct current can be employed to heat the metal layers in the finished films and finished glazing articles of the invention. A variety of voltages can be employed, including the commonly-used 12 VDC automotive voltage, the currently-planned 42 VDC automotive voltage, and other voltages as presently used or planned for use in aircraft, other vehicles and buildings.

Surprisingly, the films of the present invention retain their electrical conductivity even when stretched, bent, or creased. The films of the present invention preferably retain conductivity when strained in a tensile mode by 10% or more of their original length. Preferably, the films of the present invention retain conductivity when strained in a tensile mode by 50% or more of their original length. This is an unexpected result, since known layered films containing conductive layers lose their conductivity at strains below 10%. Similarly, known films containing inorganic layers that serve as barriers to permeability and diffusion also typically lose their barrier properties at strains lower than 10%. The films of the present invention preferably retain conductivity when bent at a 45° angle, and more preferably when bent at a 90° angle. Most preferably, the films of the present invention retain conductivity when bent or creased at a 180° angle. This is an unexpected result, since known layered films containing conductive layers lose their conductivity when bent or even when roughly handled.

The films of the invention can be manufactured much more rapidly than films made using a sputter-coated inorganic dielectric layer or a solvent-applied uncrosslinked polymeric dielectric layer. In the latter two processes the dielectric layer deposition step is a rate-limiting factor, whereas the process of the invention enables much more rapid deposition of the dielectric layer. In addition, the process of the invention can be carried out in a single chamber without removal of the film between coating steps, whereas the reported solvent-applied uncrosslinked dielectric layers appear to have been formed outside the chamber in which deposition of the metal layers took place.

The following tests were used to evaluate films of the invention:

Corrosion Test

Two strips 25.4 mm wide by about 254 to 305 mm long were cut from the center of a film sample. The strips were placed in jars containing 20% KCl solution at room temperature so that about 150 to 200 mm of each strip was immersed into the salt solution. The jar tops were screwed onto the jars to prevent the salt solution from evaporating. The strips were removed after 15 minutes of immersion, placed support side down on a dry paper towel and wiped with tissue or a paper towel along the width of the strip. Medium pressure was applied while wiping. The strips were next washed with cold water to remove salt from the surface and the film surface appearance was observed. The appearance rating was based on a visual estimate of the amount of the metal layer removed after wiping the strip, expressed as a percentage of the original metal layer area.

Corrosion Under Electrical Current Test

Two strips 25.4 mm wide by 203 mm long were cut from the center of a film sample. The narrow ends of the strips were painted on both sides with No. 22-201 silver paint (Katy Company). After the silver paint dried, copper was folded over the painted edges to form a durable electrode at each end of the strip. Alligator clips were used to connect a power supply to the copper electrodes. A voltage of 4.0 volts was applied between the contacts and the resulting current was measured and recorded. A 125 to 150 mm long section near the center of each strip was then submerged into 20% KCl solution at room temperature. The electrical current was measured and recorded during the course of the immersion time.

Adhesion Test

Squares about 254 mm wide by about 254 mm long were cut from the center of a film sample. 25.4 mm wide by 178 mm long pieces of masking tape and filament tape were each applied to the film in both the MD and TD directions, pressed with a 2.3 kg roller, then aged for one week. The adhesion test rating was based on a visual estimate of the amount of the metal layer remaining after peeling away the tapes, expressed as a percentage of the original metal layer area.

Conductivity vs. Strain Test

Films of the invention were stretched using a SINTECH™ 200/S TENSILE TESTER (Instron Corp.) in order to determine the percent strain at which the film would stop conducting electricity. A strip prepared as in the Corrosion Under Electrical Current test was clamped into the jaws of the tensile tester, and alligator clips were used to connect a power supply to the copper electrodes. While using a gauge length of 101.6 mm and a crosshead speed of 25.4 mm/min, a constant voltage of 4 volts was supplied to the strip and the current flow was measured and recorded vs. % strain.

Sheet Resistance Test

Films of the invention were evaluated for sheet resistance, or surface resistivity, using a non-contact conductivity measuring device (Model 717B Benchtop Conductance Monitor, Delcom Instruments Inc.).

Solar Heat Gain Coefficient and Shading Coefficient

The value Te is defined as the ratio, expressed in percent, of the solar energy transmitted by a specimen from 250 nm to 2500 nm divided by the total incident solar energy. The value Ae is defined as the ratio, expressed in percent, of the solar energy absorbed by a specimen from 250 nm to 2500 nm divided by the total incident solar energy. Solar properties are calculated using solar irradiance data from ASTM E891 using air mass 1.5. The Solar Heat Gain Coefficient (SHGC) is calculated as $$SHGC = Te + 0.27(Ae).$$

The Shading Coefficient (SC) is defined as the ratio of the Solar Heat Gain Coefficient through a given glazing to that through a single pane of standard 3.2 mm thick window glass, and is calculated as $$SC = SHGC/87.0.$$

EMI Shielding Strength

EMI Shielding Strength was evaluated according to ASTM D-4935, via a far field type test using a coaxial TEM cell. The results are reported in decibels (dB).

The invention will now be described with reference to the following non-limiting examples, in which all parts and percentages are by weight unless otherwise indicated.

EXAMPLE 1

(Layer 1) An approximately 300 meter long roll of 0.05 mm thick by 508 mm wide PET support (MELINEX™ No. 453 film, DuPont Teijin Films) was loaded into a roll to roll vacuum chamber like that shown in FIG. 8. The pressure in the vacuum chamber was reduced to $3 \times 10^{-4}$ torr. The support was sequentially plasma pretreated and acrylate coated during one pass at a web speed of 36.6 m/min. The plasma pretreatment utilized a chrome target and an unbalanced de magnetron operated at 1500 watts power (429 volts and 3.5 amps) under a nitrogen atmosphere with a nitrogen gas flow of 70 sccm. The acrylate coating employed a 50:50 mixture of IRR214 acrylate (UCB Chemicals) and lauryl acrylate that had been degassed for 1 hour by placing a container of the liquid monomer mixture into a bell jar and reducing pressure to approximately 1 millitorr. The degassed monomer was pumped at a flow rate of 2.35 ml/min through an ultrasonic atomizer into a vaporization chamber maintained at 274° C. Using a drum temperature of −18° C., the monomer vapor was condensed onto the moving web and electron beam crosslinked using a single filament gun operated at 7.59 kV and 2.0 milliamps.

(Layer 2) The web direction was reversed. Again operating at 36.6 m/min, the acrylate surface was plasma treated and coated with magnetron sputtered silver. The plasma pretreatment was as before but at 413 volts and 3.64 amps. The silver was sputtered at 10,000 watts power (590 volts and 16.96 amps), a drum temperature of 25° C. and an argon atmosphere with an argon gas flow of 90 sccm.

(Layer 3) The web direction was again reversed. Again operating at 36.6 m/min, a crosslinked spacing layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 7.8 kV and 3.8 milliamps.

(Layer 4) The web direction was again reversed. Again operating at 36.6 m/min, the crosslinked spacing layer was plasma pretreated and coated with magnetron sputtered silver. The plasma pretreatment was as before but using 429 volts and 3.5 amps. The silver was sputtered as before but at 590 volts, 16.94 amps, and a drum temperature of 22° C.

(Layer 5) The web direction was again reversed. A protective layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 10.11 kV and 3.8 milliamps.

Figure 10:
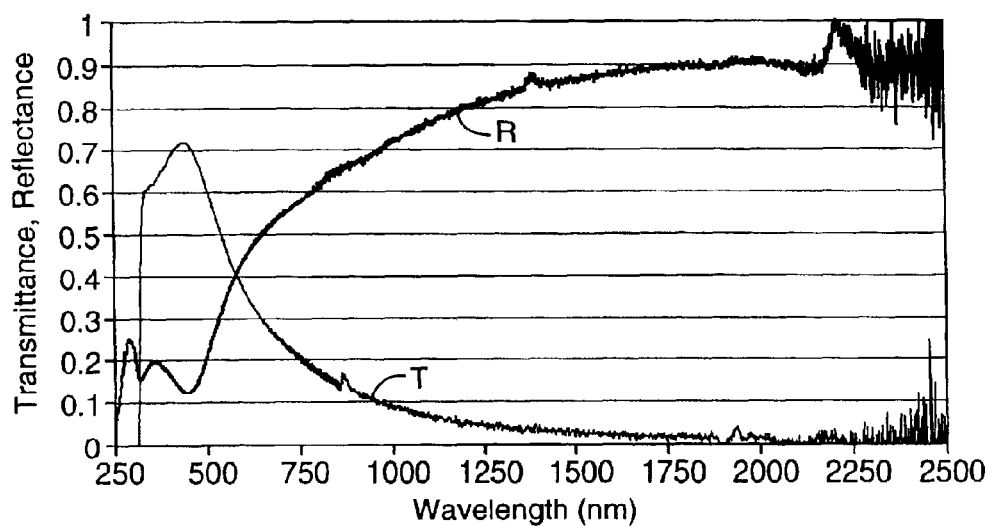
FIG. 10 and FIG. 11 are graphs showing transmittance and reflectance for two films of the invention.

The optical properties of the resulting 5 layer infrared-rejecting acrylate/Ag/acrylate/Ag/acrylate optical stack are shown in FIG. 10. Curves T and R respectively show the transmission ($T_{vis}$) and reflection for the finished film. Using optical modeling and assuming a Bruggerman density for silver of 0.97, the five layers had calculated thicknesses of 120 nm (acrylate layer 1)/12 nm (Ag layer 2)/85 nm (acrylate layer 3)/12 nm (Ag layer 4)/120 nm (acrylate layer 5).

EXAMPLE 2

Using the method of Example 1, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was as before but at 1000 watts power (402 volts and 2.5 amps) and a nitrogen gas flow of 102 sccm. The monomer flow rate was 2.45 ml/min and the vaporization chamber temperature was 276° C. The monomer vapor was condensed onto the moving web using a −21° C. drum temperature. The electron beam filament was operated at 8.0 kV and 6.5 milliamps.

(Layer 2) The plasma pretreatment was at 1000 watts power (309 volts and 3.34 amps) and a nitrogen gas flow of 90 sccm. The silver was sputtered at 570 volts and 17.88 amps, a drum temperature of 21° C. and an argon gas flow of 93.2 sccm.

(Layer 3) The silver surface was plasma pretreated prior to deposition of the spacing layer. The plasma pretreatment utilized a chrome target and 1000 watts power (308 volts and 3.33 amps). Using a drum temperature of −23° C., the monomer vapor was condensed onto the moving web and electron beam crosslinked using a single filament gun operated at 8.0 kV and 6.0 milliamps.

(Layer 4) The plasma pretreatment was at 316 volts and 3.22 amps, and the nitrogen gas flow rate was 90 sccm. The silver was sputtered at 567 volts and 17.66 amps, a drum temperature of 20° C., and an argon gas flow of 95.5 sccm.

(Layer 5) The silver surface was plasma pretreated prior to deposition of the protective layer. The plasma pretreatment was the same as in Layer 3. Using a drum temperature of −23° C., the monomer vapor was condensed onto the moving web and electron beam crosslinked using a single filament gun operated at 8.0 kV and 6.2 milliamps.

Figure 11:
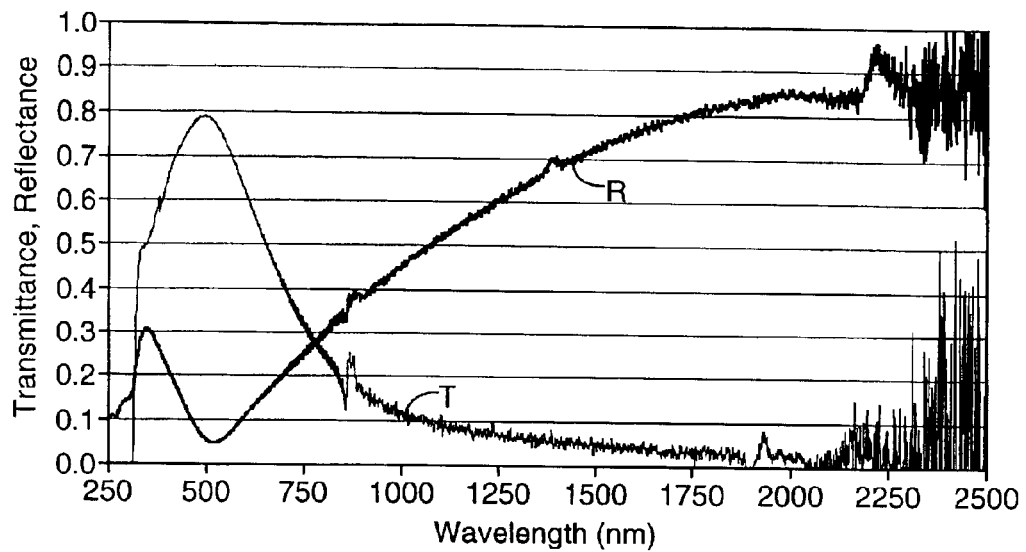

The optical properties of the resulting 5 layer infrared-rejecting acrylate/Ag/acrylate/Ag/acrylate optical stack are shown in FIG. 11. Curves T and R respectively show the transmission and reflection for the finished film. Using optical modeling and assuming a Bruggerman density for silver of 0.97, the five layers had calculated thicknesses of 120 nm (acrylate layer 1)/9 nm (Ag layer 2)/95 nm (acrylate layer 3)/9 nm (Ag layer 4)/120 nm (acrylate layer 5).

EXAMPLES 3–5

Using the method of Example 2, 5 layer infrared-rejecting acrylate/Ag/acrylate/Ag/acrylate optical stacks with silver layers of varying thickness were formed on a PET support. The resulting films were evaluated for appearance, transmission (Trans-Luminous Y ($T_{vis}$)), reflection (Refl-Luminous Y), solar heat gain coefficient (SHGC), shading coefficient (SC) and sheet resistivity. The processing conditions and evaluation results are set out below in Table 1.

TABLE 1

|  | Ex. 3 | Ex. 4 | Ex. 5 |
|---|---|---|---|
| Layer 1 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −21 | −21 | −21 |
| Monomer feed (ml/min) | 2.65 | 2.65 | 2.65 |
| Layer 2 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 26 | 26 | 26 |
| Sputter power (KW) | 10 | 10 | 10 |
| Layer 3 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −19 | −19 | −19 |
| Monomer feed (ml/min) | 2.65 | 2.65 | 2.65 |
| Layer 4 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 28 | 28 | 28 |
| Sputter power (KW) | 10 | 10 | 10 |
| Layer 5 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −18 | −18 | −18 |
| Monomer feed (ml/min) | 1.35 | 1.35 | 1.35 |
| Results: |  |  |  |
| Appearance | Good | Good | Good |
| Trans-Luminous Y ($T_{vis}$) | 72.37 | 72.14 | 71.53 |
| Refl-Luminous Y | 12.36 | 10.92 | 11.18 |
| SHGC | 46.28 | 46.84 | 48.04 |
| SC | 0.5320 | 0.5384 | 0.5522 |
| Sheet Resistivity (Ohms/Square) | 3.929 | 4.505 | 4.673 |

Figure 12:
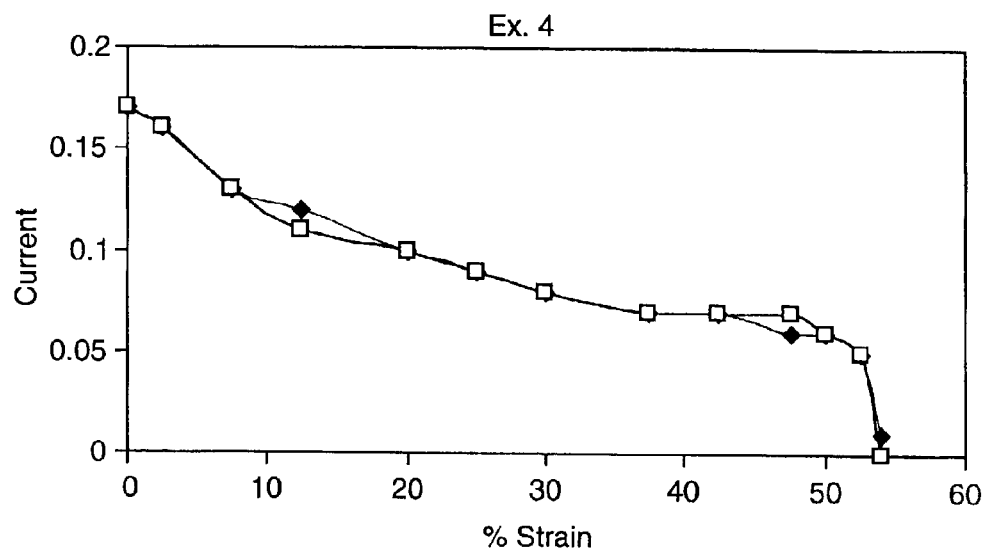
FIG. 12 through FIG. 14 are graphs showing conductance vs. strain for three films of the invention.
Figure 13:
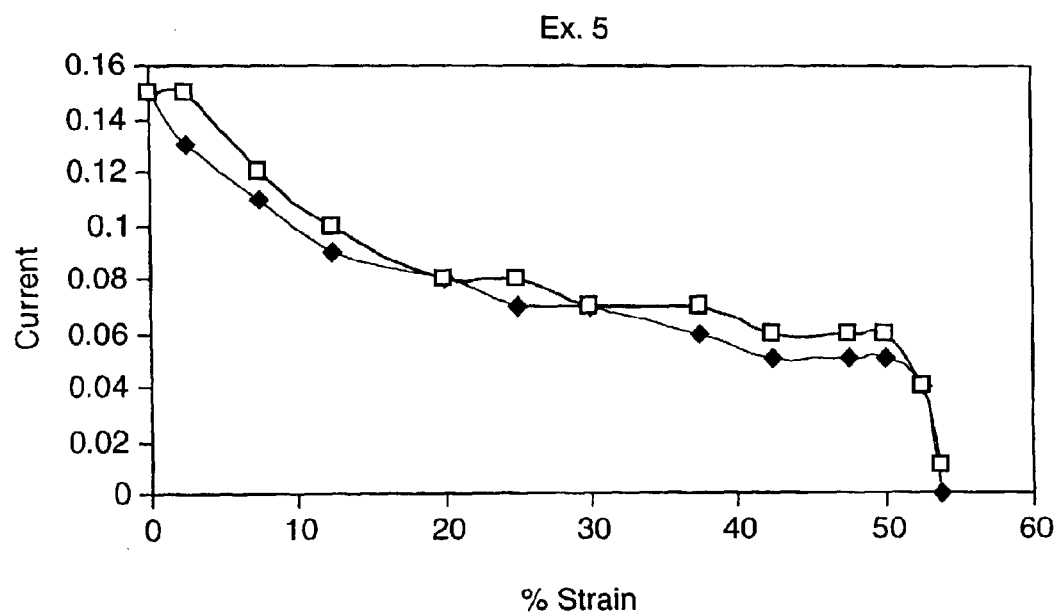

The results in Table 1 show the use of varying line speeds to alter the thickness of the metal layers. Films having a $T_{vis}$ as high as 72% and sheet resistance as low as 3.9 Ohms/square were obtained. Two samples each of the films of Examples 4 and 5 were also evaluated using the conductivity vs. strain test. The results are shown in FIG. 12 and FIG. 13, respectively. All film samples conducted current at up to 50% or more strain. The results in FIG. 12 and FIG. 13 also demonstrate that the films of the invention could be used as transparent strain gauges.

COMPARATIVE EXAMPLE 1

A commercial product based on transparent silver layers and an indium oxide inorganic dielectric (XIR™ 75 film, Southwall Technologies Inc.) was evaluated using the conductivity vs. strain test. The sample failed when subjected to only 1% strain.

EXAMPLES 6–11

Figure 14:
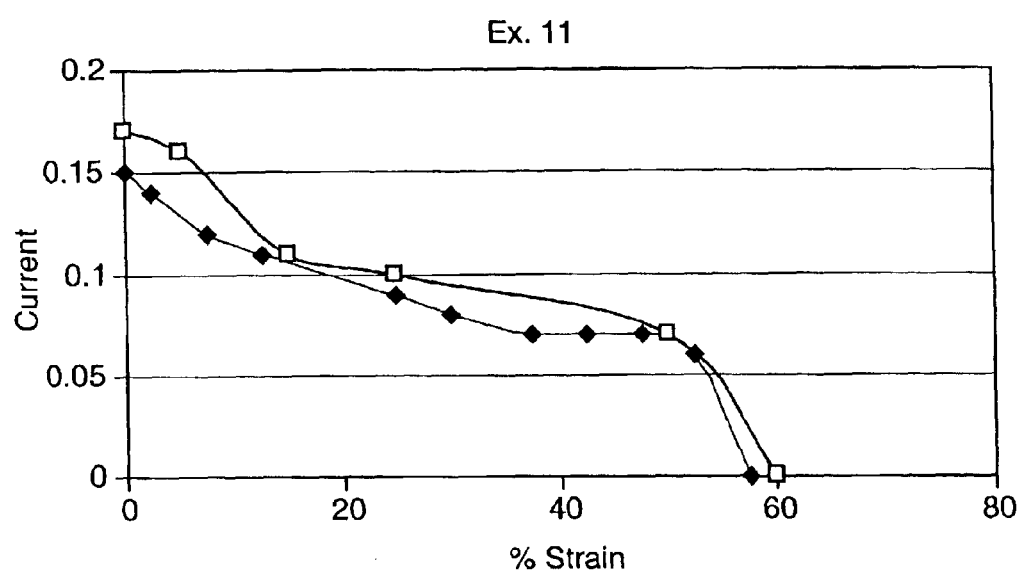

Using the method of Examples 3 through 5, 5 layer infrared-rejecting acrylate/Ag/acrylate/Ag/acrylate optical stacks were formed on a PET support (Examples 6–9) or a birefringent multilayer optical film support (3M™ Solar Reflecting Film No. 41-4400-0146-3, Examples 10–11) and optionally given a plasma post-treatment. The thickness of layer 5 was varied by altering the deposition conditions as shown below. The resulting films were evaluated for appearance, transmission, reflection, solar heat gain coefficient, shading coefficient and sheet resistivity. The processing conditions and evaluation results are set out below in Table 2.

optional plasma post-treatment of the topcoat. Films having a $T_{vis}$ as high as about 73% and sheet resistance as low as 3.9 Ohms/square were obtained. Two samples of the film of Example 11 were also evaluated using the conductivity vs. strain test. The results are shown in FIG. 14. Both film samples conducted current at up to 50% or more strain.

EXAMPLE 12

Using the method of Example 2, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was at 1000 watts power but using 322 volts, 3.15 amps and a nitrogen

TABLE 2

| Support | Ex. 6 PET | Ex. 7 PET | Ex. 8 PET | Ex. 9 PET | Ex. 10 MOF | Ex. 11 MOF |
|---|---|---|---|---|---|---|
| Layer 1 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −21 | −21 | −21 | −21 | −21 | −21 |
| Monomer feed (ml/min) | 2.65 | 2.65 | 2.65 | 2.65 | 2.65 | 2.65 |
| Layer 2 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 26 | 26 | 26 | 26 | 19 | 19 |
| Sputter power (KW) | 10 | 10 | 10 | 10 | 10 | 10 |
| Layer 3 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −19 | −19 | −19 | −19 | −20 | −20 |
| Monomer feed (ml/min) | 2.65 | 2.65 | 2.65 | 2.65 | 2.85 | 2.85 |
| Layer 4 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 28 | 28 | 28 | 28 | 23 | 23 |
| Sputter power (KW) | 10 | 10 | 10 | 10 | 10 | 10 |
| Layer 5 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −18 | −18 | −18 | −18 | −17 | −17 |
| Monomer feed (ml/min) | 1.45 | 1.25 | 1.35 | 1.35 | 1.35 | 1.35 |
| Plasma Post-Treatment | | | | | | |
| Line speed (m/min) | | | 36.6 | 36.6 | | 36.6 |
| Plasma (Watts) | | | 1500 | 1000 | | 1000 |
| Results: | | | | | | |
| Appearance | Good | Good | Good | Good | Good | Good |
| Trans-Luminous Y ($T_{vis}$) | 71.51 | 70.09 | 68.19 | 72.59 | 72.69 | 72.51 |
| Refl-Luminous Y | 11.73 | 12.02 | 11.86 | 7.75 | 11.16 | 10.15 |
| SHGC | 46.60 | 46.25 | 44.82 | 46.81 | 44.97 | 45.63 |
| SC | 0.5356 | 0.5316 | 0.5152 | 0.5381 | 0.5169 | 0.5244 |
| Sheet Resistivity (Ohms/Square) | 4.23 | 4.38 | 5.709 | 5.208 | 3.927 | 4.389 |

The results in Table 2 show the use of two different substrates, varying protective topcoat thickness and an gas flow of 70 sccm. The monomer flow rate was 2.65 ml/min and the vaporization chamber temperature was 274°

C. The monomer vapor was condensed onto the moving web using a −20° C. drum temperature. The electron beam filament was operated at 8.04 kV and 5.7 milliamps.

(Layer 2) The plasma pretreatment was at 1000 watts power but using 378 volts, 3.09 amps and a nitrogen gas flow of 70 sccm. The silver was sputtered at 547 volts, 18.36 amps, a drum temperature of 26° C. and an argon gas flow of 70 sccm.

(Layer 3) The plasma pretreatment was at 1000 watts power but using 327 volts and 3.1 amps. The monomer vapor was condensed onto the moving web using a drum temperature of −19° C. The electron beam filament was operated at 8.04 kV and 6.3 milliamps.

(Layer 4) The plasma pretreatment was at 1000 watts power but using 328 volts, 3.07 amps and a nitrogen gas flow rate of 70 sccm. The silver was sputtered at 546 volts, 18.34 amps, a drum temperature of 28° C., and an argon gas flow of 70 sccm.

(Layer 5) The plasma pretreatment was at 1000 watts power but using 359 volts and 2.82 amps. The monomer vapor was condensed onto the moving web using a drum temperature of −18° C. The electron beam filament was operated at 8.04 kV and 4.6 milliamps.

Figure 15:
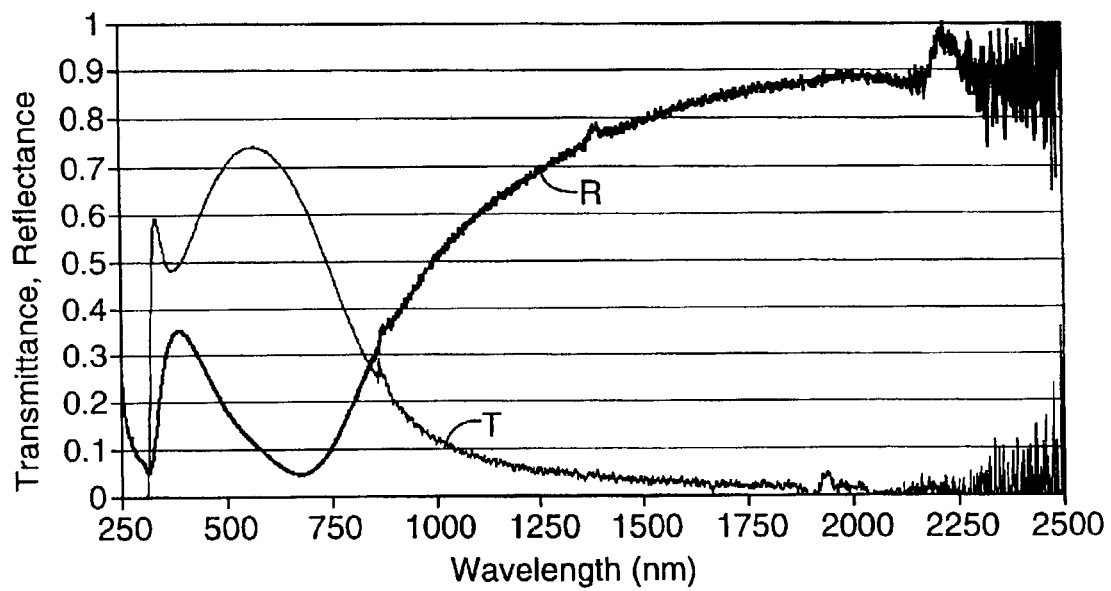
FIG. 15 is a graph showing transmittance and reflectance for a film of the invention.

The optical properties of the resulting 5 layer infrared-rejecting acrylate/Ag/acrylate/Ag/acrylate optical stack are shown in FIG. 15. Curves T and R respectively show the transmission and reflection for the finished film. The film had a $T_{vis}$ of 71.5%. The film was next cut into a 30.5 cm by 2.54 cm strip. The edges were painted with a silver conductive paint (SILVER PRINT™, O.K. Thorsen Inc.). A 2.54 cm by 2.54 cm copper foil was folded over each of the opposing narrow ends of the strip and connected using test leads equipped with alligator clips to a 0–20 volt power supply (Model 6253A dual DC, Hewlett Packard, Inc.). A voltage was applied to the strip and the current and strip temperature were measured as a function of time. When the strip temperature stopped increasing, a higher voltage was applied. The results are shown below in Table 3.

TABLE 3

| Time (min) | Volts | Amps | Power (W) | Power (W/cm²) | Temp (° C.) |
| --- | --- | --- | --- | --- | --- |
| 0 | 0 | 0 | — | — | 23.4 |
| 1 | 16 | 0.265 | 4.24 | 0.0548 | 51.3 |
| 2 | 16 | 0.265 | 4.24 | 0.0548 | 54 |
| 3 | 16 | 0.265 | 4.24 | 0.0548 | 55.4 |
| 4 | 16 | 0.265 | 4.24 | 0.0548 | 56.4 |
| 6 | 16 | 0.265 | 4.24 | 0.0548 | 57.8 |
| 10 | 16 | 0.265 | 4.24 | 0.0548 | 58.8 |
| 11 | 20 | 0.34 | 6.8 | 0.0878 | 69.9 |
| 12 | 20 | 0.34 | 6.8 | 0.0878 | 73.1 |
| 15 | 20 | 0.34 | 6.8 | 0.0878 | 75.6 |
| 17 | 20 | 0.34 | 6.8 | 0.0878 | 76.4 |
| 19 | 20 | 0.34 | 6.8 | 0.0878 | 76.3 |
| 21 | 24 | 0.42 | 10.08 | 0.1302 | 103.1 |
| 22 | 24 | 0.42 | 10.08 | 0.1302 | 99.8 |
| 23 | 24 | 0.42 | 10.08 | 0.1302 | 103.5 |
| 25 | 24 | 0.42 | 10.08 | 0.1302 | 105.4 |
| 29 | 24 | 0.42 | 10.08 | 0.1302 | 106.9 |
| 33 | 24 | 0.42 | 10.08 | 0.1302 | 107.4 |
| 34 | 24 | 0.42 | 10.08 | 0.1302 | 107.4 |

The results in Table 3 show that the film could withstand very high power densities and very high temperatures without circuit failure. The strip was allowed to cool and then 16 volts were applied to the strip, resulting in a measured current of 0.27 amps. The film became warm to the touch. The film was next bent over the edge of a counter top at a 45° angle, and then at a 90° angle. The film still felt warm to the touch and the current remained at 0.27 amps. The film was next bent at a 180° angle. The sample still felt warm to the touch and the current remained at 0.27 amps. Had cracking occurred, hot spots would have arisen in the film and a substantial current change (or a complete cessation of current flow) would have been observed.

COMPARATIVE EXAMPLE 2

Using the method of Example 20, a sample of XIR™ 75 film (Southwall Technologies Inc.) was powered and heated. The sample failed when subjected to 24 volts or when bent. The results are set out below in Table 4.

TABLE 4

| Time (min) | Volts | Amps | Power (W) | Power (W/cm²) | Temp (° C.) |
| --- | --- | --- | --- | --- | --- |
| 0 | 8 | 0.122 | 0.976 | 0.0130 | 23.1 |
| 2 | 8 | 0.122 | 0.976 | 0.0130 | 32.3 |
| 4 | 8 | 0.122 | 0.976 | 0.0130 | 33 |
| 6 | 8 | 0.122 | 0.976 | 0.0130 | 33.4 |
| 7 | 8 | 0.122 | 0.976 | 0.0130 | 33.6 |
| 8 | 8 | 0.122 | 0.976 | 0.0130 | 33.4 |
| 10 | 12 | 0.182 | 2.184 | 0.0291 | 41.7 |
| 11 | 12 | 0.182 | 2.184 | 0.0291 | 42.5 |
| 12 | 12 | 0.182 | 2.184 | 0.0291 | 43 |
| 13 | 12 | 0.182 | 2.184 | 0.0291 | 43.1 |
| 14 | 12 | 0.182 | 2.184 | 0.0291 | 43.5 |
| 15 | 12 | 0.182 | 2.184 | 0.0291 | 43.6 |
| 16 | 12 | 0.182 | 2.184 | 0.0291 | 43.6 |
| 17 | 12 | 0.182 | 2.184 | 0.0291 | 43.7 |
| 18 | 12 | 0.182 | 2.184 | 0.0291 | 43.7 |
| 20 | 16 | 0.24 | 3.84 | 0.0512 | 53.3 |
| 22.5 | 16 | 0.24 | 3.84 | 0.0512 | 55.1 |
| 25 | 16 | 0.24 | 3.84 | 0.0512 | 55.7 |
| 26 | 16 | 0.24 | 3.84 | 0.0512 | 55.7 |
| 27 | 16 | 0.24 | 3.84 | 0.0512 | 55.5 |
| 28 | 16 | 0.24 | 3.84 | 0.0512 | 55.7 |
| 30 | 20 | 0.29 | 5.8 | 0.0773 | 67.3 |
| 32 | 20 | 0.29 | 5.8 | 0.0773 | 71.2 |
| 34 | 20 | 0.29 | 5.8 | 0.0773 | 72 |
| 37.5 | 20 | 0.29 | 5.8 | 0.0773 | 72.3 |
| 38 | 20 | 0.29 | 5.8 | 0.0773 | 72.8 |
| 39 | 20 | 0.29 | 5.8 | 0.0773 | 72.7 |
| 40 | 20 | 0.29 | 5.8 | 0.0773 | 72.7 |
| 41 | 24 | 0 | (Failed) | (Failed) | — |

The results in Table 4 show that the comparison film could be electrically heated. However, when the voltage was increased to 24 volts the film failed. This was believed to be due to cracking of the indium oxide layer. A separate sample of the comparison film was electrically heated using an applied voltage of 16 volts, resulting in a measured current of 0.235 amps. The comparison film became warm to the touch. When the comparison film was bent over the edge of a counter top at a 45° angle, the film failed. Using optical microscopy, a crack could be observed in the coating.

EXAMPLE 13

A 304 mm by 304 mm sample of the film of Example 5 having a sheet resistance of 4.2 ohms/square was electrically joined to busbars so that both metal layers could be energized. The film sample was laminated into the center of a sandwich made from two 0.05 mm thick sheets of PVB placed between two 2 mm glass sheets. The bus to bus resistance was 4.06 ohms. A potential of 16.5 volts was applied to the busbars resulting in a current of 4.06 amps and an applied power density of 299 W/mm². Within 7 minutes of turning on the voltage, the surface temperature of the glass increased by 20° C. The results are set out below in Table 5, along with the times required to increase the surface temperature by 20° C. at three other applied power densities.

TABLE 5

| Applied Power Density (W/mm$^2$) | Time to increase surface temperature by 20° C. (min) |
|---|---|
| 239 | 9.5 |
| 299 | 7 |
| 580 | 4 |
| 645 | 3.5 |

Using a 42 volt supply, these times would provide useful de-icing performance in windshields of average size, viz., about 0.9 m by about 1.5 m for a typical car windshield and about 0.88 m by about 1.66 m for a typical sport utility vehicle windshield.

EXAMPLE 14

Several films of the invention were subjected to optional plasma post-treatments on one or both sides of the film using the plasma conditions of Example 9, and then laminated between glass sheets as in Example 13. The laminates were evaluated to determine their compressive shear strength. Set out below in Table 6 is the example number, presence or absence of plasma post-treatment atop the uppermost layer of the stack or on the underside of the support, and the measured compressive shear strength.

TABLE 6

| Example No. | Substrate | Plasma atop Stack | Plasma under Support | Compressive Shear (Mpa) |
|---|---|---|---|---|
| — | Uncoated PET | No | No | 5.92 |
| 3 | PET | No | No | 1.67 |
| 4 | PET | No | No | 1.72 |
| 5 | PET | No | No | 1.48 |
| 8 | PET | Yes | No | 5.3 |
| 9 | PET | Yes | No | 5.01 |
| 9 | PET | Yes | Yes | 7.29 |
| 10 | MOF | No | No | 1.5 |
| 11 | MOF | Yes | No | 6.35 |
| 11 | MOF | Yes | Yes | 15.19 |

EXAMPLE 15

A PET support was covered with a three layer acrylate/Ag/acrylate stack. The individual layers were formed as follows:

(Layer 1) A 914 meter long roll of 0.05 mm thick×508 mm wide PET film (MELINEX™ No. 453 film, DuPont-Teijin Films) was loaded into a roll to roll vacuum chamber, and the chamber pressure was pumped to a pressure of 8×10$^{-6}$ torr. The PET film was coated with an acrylate mixture containing 48.5% IRR214 acrylate, 48.5% lauryl acrylate, and 3.0% EBECRYL™ 170 adhesion promoter. The acrylate mixture was vacuum degassed prior to coating, and pumped at a flow rate of 2.35 ml/min. through an ultrasonic atomizer into a vaporization chamber maintained at 275° C. The PET film was passed over a coating drum maintained at 0° C. at a web speed of 30.4 meters/min, where the monomer vapor was condensed, then subsequently electron beam crosslinked with a single filament operated at 8.0 kV and 2.0 milliamps. This produced an acrylate layer having a 100 nm thickness after cure.

(Layer 2) The web direction was reversed inside the chamber, and the acrylate surface was sputter coated with a silver layer. The silver was sputtered at 10,000 watts power, using argon as the sputtering gas at a chamber pressure of 2.0 millitorr, and a web speed of 30.4 meters/minute to provide a 10 nm thick silver layer.

(Layer 3) The web direction was again reversed. Using the same conditions as for Layer 1, a 100 nm thick acrylate layer was deposited onto the silver layer.

The resulting three layer film stack exhibited good spectral transmission and reflectance characteristics, and had an electrical resistivity of 10 ohms/sq. When the Corrosion Under Electrical Current Test was performed the current fell to zero a few seconds after immersion. This indicated that more that silver corrosion and electrical circuit failure had taken place more rapidly than would be desirable under severe corrosion conditions.

EXAMPLE 16

A second three layer film stack was prepared in the same manner as Example 15, but using a nitrogen plasma pretreatment (of the PET, Layer 1 acrylate coating, and Layer 2 silver coating) prior to the deposition of the subsequent layer. The nitrogen plasma was applied using an unbalanced dc magnetron source, operated at 1.0 kW and 2.0 millitorr pressure. When the Corrosion Under Electrical Current Test was performed the current did not fall to zero until 500 to 600 seconds after immersion, indicating much slower silver corrosion and electrical circuit failure than in Example 15.

EXAMPLE 17

A three layer film stack was prepared in the same manner as Example 15, with the addition of 2% ethylene glycol bis-thioglycolate to the monomer mixture. When the Corrosion Under Electrical Current Test was performed the current fell to zero 500 to 600 seconds after immersion, indicating slower silver corrosion and electrical circuit failure than in Example 15, and comparable performance to Example 16.

EXAMPLE 18

A three layer film stack was prepared in the same manner as Example 15, but using nitrogen plasma pretreatment as in Example 16 and a 2% ethylene glycol bis-thioglycolate addition as in Example 17. When the Corrosion Under Electrical Current Test was performed the current remained constant for over 900 seconds after immersion, at which time the test was terminated. This indicated that silver corrosion and the likelihood of circuit failure had been further reduced in comparison to Examples 15 to 17.

EXAMPLE 19

The film of Example 12 was tested for optical transmission at 550 nm, Sheet Resistance and EMI Shielding Strength. The measured optical transmission was 75%, the surface resistivity was 4.5 Ohm/sq, and the EMI shielding strength was 29 dB.

COMPARATIVE EXAMPLE 3

Using the method of Example 19, a sample of AgHT4™ optically transparent EMI shielding film (CP Films) was evaluated. The measured optical transmission was 76%, the surface resistivity was 4.7 Ohm/sq, and the EMI shielding strength was 29 dB. The film was crinkled by hand and retested for EMI Shielding Strength. The EMI shielding strength decreased to 5 dB. A fresh sample of the film was also evaluated for corrosion and strain resistance. Circuit failure occurred in 20 seconds in the Corrosion Under Electrical Current Test, and conductivity fell to zero at 2% strain in the Conductivity vs. Strain Test.

EXAMPLE 20

Using the method of Example 12, a PET support was covered with a five layer acrylate/Ag/acrylate/Ag/acrylate optical stack using plasma pretreatment on both the top and bottom of the metal layers. The monomer mixture contained 2% ethylene glycol bis-thioglycolate. The other individual layer differences were as follows:

(Layer 1) The support plasma pretreatment was at 1000 watts power but using 428 volts and 2.3 amps. The monomer vapor was condensed onto the moving web using a −17° C. drum temperature. The electron beam filament was operated at 8.0 kV and 2.8 milliamps.

(Layer 2) The plasma pretreatment was at 1000 watts power but using 368 volts and 2.72 amps. The silver was sputtered at 632 volts, 15.8 amps, a drum temperature of 31° C. and an argon gas flow of 87 sccm.

(Layer 3) The plasma pretreatment was at 1000 watts power but using 430 volts and 2.3 amps. The monomer vapor was condensed onto the moving web using a drum temperature of −17° C. The electron beam filament was operated at 8.0 kV and 4.8 milliamps.

(Layer 4) The plasma pretreatment was at 1000 watts power but using 368 volts and 2.72 amps. The silver was sputtered at 634 volts, 15.8 amps, a drum temperature of 32° C., and an argon gas flow of 87 sccm.

(Layer 5) The plasma pretreatment was at 1000 watts power but using 448 volts and 2.2 amps. The monomer vapor was condensed onto the moving web using a drum temperature of −19° C. The electron beam filament was operated at 8.0 kV and 5.7 milliamps.

The measured optical transmission of the resulting film was 70%, the surface resistivity was 5.6 Ohm/sq, and the EMI Shielding Strength was 28 dB. The film was crinkled by hand as in Comparative Example 3 and retested for EMI Shielding Strength. The EMI Shielding Strength remained at 28 dB, indicating full retention of EMI shielding ability.

Various modifications and alterations of this invention will be apparent to those skilled in the art without departing from this invention. This invention should not be restricted to that which has been set forth herein only for illustrative purposes.

We claim:

1. An electrically conductive visible light-transmissive film comprising electrically connected first and second visible light-transmissive metal or metal alloy layers separated by a visible light-transmissive crosslinked polymeric layer wherein the film is extensible.

2. A film according to claim 1 further comprising a flexible plastic support.

3. A film according to claim 2 further comprising a polymeric base coat layer between the support and the first metal or metal alloy layer.

4. A film according to claim 2 wherein an interface between the metal or metal alloy layers and adjacent layers within the film has been subjected to an adhesion-enhancing treatment, or one or more of the adjacent layers comprises an adhesion-enhancing adjuvant, whereby the interlayer adhesion is increased.

5. A film according to claim 4 wherein each of the metal or metal alloy layers and adjacent layers has been subjected to plasma treatment.

6. A film according to claim 2 wherein the film is stretched.

7. A film according to claim 2 wherein the film retains electrical conductivity when strained in a tensile mode by 10% of its original length.

8. A film according to claim 1 further comprising one or more pairs of an additional crosslinked polymeric spacing layer and an additional metal or metal alloy layer atop the second metal layer.

9. A film according to claim 1 wherein the metal or metal alloy layers comprise silver and the crosslinked polymeric layer comprises an acrylate polymer.

10. A film according to claim 1 wherein the film can be laminated into an automotive windshield without substantial wrinkling.

11. A film according to claim 1 wherein each of the layers is electrically connected.

12. A safety glazing pre-laminate comprising at least one layer of a mechanical energy-absorbing material joined to a visible light-transmissive extensible film comprising first and second visible light-transmissive metal or metal alloy layers separated by a visible light-transmissive crosslinked polymeric layer and further comprising electrodes that permit electrical current to be supplied to the metal or metal alloy layers.

13. An electrically heatable glazing article comprising at least one layer of a glazing material joined to a visible light-transmissive extensible film comprising first and second visible light-transmissive metal or metal alloy layers separated by a visible light-transmissive crosslinked polymeric layer and further comprising electrodes that permit electrical current to be supplied to the metal or metal alloy layers.

14. An article according to claim 13 wherein an interface between the metal or metal alloy layers and adjacent layers within the film has been subjected to an adhesion-enhancing treatment, or one or more of the adjacent layers comprises an adhesion-enhancing adjuvant, whereby the interlayer adhesion is increased.

15. An article according to claim 14 wherein one or more of the metal or metal alloy layers or adjacent layers has been subjected to plasma treatment.

16. An article according to claim 13 wherein the metal or metal alloy layers comprise silver and the crosslinked polymeric layer comprises an acrylate polymer.

17. An article according to claim 13 wherein the glazing material comprises non-planar glass and the article is optically clear and infrared-reflective.

18. An article according to claim 13 comprising a windshield.

19. An article according to claim 13 comprising architectural glazing.

20. A vehicle with electrically heatable glazing comprising at least one windshield, backlight, side window or skylight comprising an extensible film comprising first and second visible light-transmissive metal or metal alloy layers separated by a crosslinked visible light-transmissive polymeric layer and further comprising electrodes that permit electrical current to be supplied to the metal or metal alloy layers.

21. A vehicle according to claim 20 wherein the metal or metal alloy layers comprise silver and the crosslinked polymeric layer comprises an acrylate polymer.

* * * * *

UNITED STATES PATENT AND TRADEMARK OFFICE
CERTIFICATE OF CORRECTION

PATENT NO. : 6,933,051 B2
DATED : August 23, 2005
INVENTOR(S) : Fleming, Robert J.

It is certified that error appears in the above-identified patent and that said Letters Patent is hereby corrected as shown below:

Title page,
Item [56], References Cited, U.S. PATENT DOCUMENTS, delete "Hogmeister et al." and insert -- Hofmeister et al. --, therefor.

Column 4,
Line 31, delete "in-place" and insert -- in-plane --, therefor.

Column 13,
Line 65, after "adhesive." delete "herewith and entitled "Durable Transparent EMI Shielding Film", incorporated herein".

Column 16,
Line 36, delete "de" and insert -- dc --, therefor.

Column 25,
Line 52, after "layer" insert -- , --.

Signed and Sealed this

Fifteenth Day of November, 2005

JON W. DUDAS
*Director of the United States Patent and Trademark Office*